(12) United States Patent
Matsumoto et al.

(10) Patent No.: US 8,008,650 B2
(45) Date of Patent: Aug. 30, 2011

(54) TRANSISTOR WITH NANOTUBE STRUCTURE EXHIBITING N-TYPE SEMICONDUCTOR-LIKE CHARACTERISTICS

(75) Inventors: Kazuhiko Matsumoto, Ibaraki (JP); Atsuhiko Kojima, Ushiku (JP); Satoru Nagao, Ushiku (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 0 days.

(21) Appl. No.: 12/955,972

(22) Filed: Nov. 30, 2010

(65) Prior Publication Data

US 2011/0068324 A1 Mar. 24, 2011

Related U.S. Application Data

(63) Continuation of application No. 11/815,871, filed as application No. PCT/JP2006/302349 on Feb. 10, 2006, now Pat. No. 7,902,089.

(30) Foreign Application Priority Data

Feb. 10, 2005 (JP) ................................ 2005-034476

(51) Int. Cl.
*H01L 29/06* (2006.01)
(52) U.S. Cl. ............. 257/24; 257/E21.108; 257/E29.07; 438/744
(58) Field of Classification Search ........... 257/E21.102, 257/24
See application file for complete search history.

(56) References Cited

U.S. PATENT DOCUMENTS

| 5,308,999 | A | 5/1994 | Gotou |
| 2002/0012937 | A1 | 1/2002 | Tender et al. |
| 2002/0016084 | A1 | 2/2002 | Todd |
| 2004/0238887 | A1 | 12/2004 | Nihey |

FOREIGN PATENT DOCUMENTS

| JP | 2003-17508 | 1/2003 |
| JP | 2004-64059 | 2/2004 |

OTHER PUBLICATIONS

Wind, et al., "Vertical scaling of carbon nanotube field-effect transistors using top gate electrodes", Applied Physics Letters, vol. 80, No. 20, pp. 3817-3819 (2002).
Heinze, et al., "Carbon Nanotubes as Schottky Barrier Transistors", Physical Review Letters, vol. 89, No. 10, pp. 106801-1 thru 106801-4 (2002).
Derycke, et al., "Controlling doping and carrier injection in carbon nanotube transistors", Applied Physics Letters, vol. 80, No. 15, pp. 2773-2775 (2002).
Kong, et al., "Full and Modulated Chemical Gating of Individual Carbon Nanotubes by Organic Amine Compounds", Journal of Physical Chemistry, B105, pp. 2890-2893 (2001). Lu, et al., "Polymer Electrolyte-Gated Carbon Nanotube Field-Effect Transistor", Nano letters, vol. 4, No. 4, pp. 623-627 (2004).
Bachtold, et al., "Logic Circuits with Carbon Nanotube Transistors", Science, vol. 294, pp. 1317-1320 (2001).
Javey, et al., "High-k dielectrics for advanced carbon-nanotube transistors and logic gates", Nature Materials, vol. 1, pp. 241-246 (2002).

*Primary Examiner* — Ajay K Arora
(74) *Attorney, Agent, or Firm* — Oblon, Spivak, McClelland, Maier & Neustadt, L.L.P.

(57) ABSTRACT

An object of the present invention is to provide a new n-type transistor, different from the prior art, using a channel having a nanotube-shaped structure, and having n-type semiconductive properties. To realize this, a film of a nitrogenous compound 6 is formed directly on a channel 5 of a transistor 1 comprising a source electrode 2, a drain electrode 3, a gate electrode 4 and the n-type channel 5 having a nanotube-shaped structure and provided between the source electrode 2 and the drain electrode 3.

14 Claims, 9 Drawing Sheets

TRANSISTOR WITH NANOTUBE STRUCTURE EXHIBITING N-TYPE SEMICONDUCTOR-LIKE CHARACTERISTICS

This is a continuation application of U.S. application Ser. No. 11/815,871, filed Oct. 5, 2007, which is a 371 of PCT/JP06/302349 filed on Feb. 10, 2006.

FIELD OF THE INVENTION

The present invention relates to an n-type transistor and n-type transistor sensor having a nanotube-shaped structure as an n-type channel, a method for manufacturing a channel for the n-type transistor, and a method for manufacturing a nanotube-shaped structure exhibiting n-type semiconductive properties.

DESCRIPTION OF THE RELATED ART

Transistors are devices, which convert a voltage signal to be input to a gate into a current signal to be output from a source electrode or drain electrode. Upon application of a voltage between the source and drain electrodes, charged particles existing in the channel provided therebetween move between the source and drain electrodes along the direction of the electric field, and are output as a current signal from the source or drain electrode. At this time, the strength of the current signal to be output is in proportion to the density of the charged particles. Upon application of a voltage to the gate that is provided above, on the side surface or below the channel through an insulator, the density of the charged particles in the channel changes. With this variation, changing the gate voltage can change the current signal.

In recent years, for further high integration of large-scale integrated circuits, etc., transistors using a nano-scale nanotube-shaped structure have drawn attention. Of nanotube-shaped structures, especially with a technique using the carbon nanotube, transistors using the carbon nanotube for the channel generally exhibit p-type semiconductive properties in the air. It can be considered that the p-type semiconductive properties are due to oxygen adsorbed near the carbon nanotube or the interface between the carbon nanotube and the source or drain electrode. Particularly, in the former case, holes are doped to the carbon nanotube due to oxygen. On the other hand, in the latter case, a Schottky barrier between the source or drain electrode and the carbon nanotube is modulated due to oxygen adsorption.

In consideration of the future device applications, there remains a strong need for manufacturing carbon nanotube transistors exhibiting n-type semiconductive properties stably in the air. Recently, various techniques have been proposed for manufacturing the n-type carbon nanotube transistors. Examples of such techniques are: a method for doping potassium, organic molecules or the like into the carbon nanotube; a method for coating organic solid electrolytes on a source electrode, a drain electrode and a carbon nanotube channel; and a method for removing oxygen by conducting thermal treatment at a temperature of 200° C. or greater under a vacuum, nitrogen atmosphere or hydrogen atmosphere, thereafter putting silicon oxide or zirconium oxide as a cap (Non-Patent Documents 1 to 7).

Non-Patent Document 1: S. J. Wind, J. Appenzeller, R. Martel, V. Derycke and P. Avouris: Appl. Phys. Lett. 80 (2002) 3817-3819.

Non-Patent Document 2: S. Heinze, J. Tersoff, R. Martel, V. Derycke, J. Appenzeller and P. Avouris: Phys. Rev. Lett. 89 (2002) 106801-1-4.

Non-Patent Document 3: V. Derycke, R. Martel, J. Appenzeller and P. Avouris: Appl. Phys. Lett. 80 (2002) 2773-2775.

Non-Patent Document 4: J. Kong and H. Dai: J. Phys. Chem. B105 (2001) 2890-2893

Non-Patent Document 5: C. Lu, Q. Fu, S. Huang and J. Lie: Nano Lett. 4 (2004) 623-627.

Non-Patent Document 6: A. Bachtold, P. Hadley, T. Nakanishi and C. Dekker: Science 294 (2001) 1317-1320.

Non-Patent Document 7: A. Javey, H. Kim, M. Brink, Q. Wang, A. Ural, J. Guo, P. Mcintyre, P. Mceuen, M. Lundstrom and H. Dai: Nature Mater. 1 (2002) 241-246.

SUMMARY OF THE INVENTION

Problems to be Solved by the Invention

Non-Patent Documents 1 to 7 disclose n-type transistors having the conventional carbon nanotube as a channel. However, their performance capabilities are not sufficient, thus there is a great demand for further improvement. For example, whenpotassium is doped into the carbon nanotube, potassium may contaminate silicon oxide. It can be considered that the organic molecule-doped carbon nanotube may have low heat resistance.

Further, when the carbon nanotube is coated with organic electrolytes, the solid electrolytes may have low heat resistance. Thus, the transistor may not have a sufficient level of heat resistance.

If the carbon nanotube is to be capped after thermal treatment, it requires much work for the thermal treatment. Further, when silicon oxide is formed as a film, employed generally is a plasma chemical vapor deposition (p-CVD) process to be performed at a low temperature. However, the carbon nanotube may be damaged by the plasma and oxygen.

Similarly, the performance capabilities of the n-type transistors are not sufficient, when a different kind of nanotube-shaped structure is used as a channel.

The present invention has been made in consideration of the above. It is an object of the present invention to provide, in transistors using a nanotube-shaped structure as a channel, a new n-type transistor different from the prior art, an n-type transistor sensor using the same, a method for manufacturing a channel for the n-type transistor, and a method for manufacturing a nanotube-shaped structure exhibiting n-type semiconductive properties.

Means for Solving the Problems

As a result of intensive study in view of the problems, the present inventors have found it possible to obtain an n-type transistor by forming a film of a nitrogenous compound under predetermined conditions in a transistor having a nanotube-shaped structure exhibiting p-type semiconductive properties as a channel, and have completed the present invention.

That is, the subject matter of the present invention relates to an n-type transistor comprising: a source electrode; a drain electrode; a gate electrode; an n-type channel which has a nanotube-shaped structure and is provided between the source electrode and the drain electrode; and a film of a nitrogenous compound which is formed directly on the channel. As a result, it is possible to obtain a new n-type transistor having a nanotube-shaped structure as a channel.

At this time, the film of the nitrogenous compound preferably has an oxygen content of 0 atomic % or more and 10 atomic % or less.

The film of the nitrogenous compound preferably has a hydrogen content of 5 atomic % or more and 20 atomic % or less.

The film of the nitrogenous compound is preferably formed only on a top and side of the channel.

At this time, the nanotube-shaped structure is preferably a carbon nanotube.

The nitrogenous compound is preferably silicon nitride.

The gate electrode is preferably a top gate which is formed on the channel through the film of the nitrogenous compound.

Further, another subject matter of the present invention relates to an n-type transistor sensor comprising: a source electrode; a drain electrode; an n-type channel which has a nanotube-shaped structure and is provided between the source electrode and the drain electrode; and a film of a nitrogenous compound which is formed directly on the channel, wherein the sensor detects a target object to be detected as a variation of a current flowing through the channel. As a result, it is possible to obtain a high sensitivity transistor sensor having the nanotube-shaped structure as an n-type channel.

Still another subject matter of the present invention relates to a method for manufacturing a channel for an n-type transistor, comprising the step of forming a film of a nitrogenous compound directly on a nanotube-shaped structure exhibiting p-type semiconductive properties using a thermal CVD technique, at a temperature of the nanotube-shaped structure of 500° C. or higher and 1600° C. or lower. As a result, it is possible to obtain a new channel for an n-type transistor having the nanotube-shaped structure as a channel, more easily than the prior art. In addition, it is possible to obtain a new n-type transistor having the nanotube-shaped structure as a channel, more easily than the prior art.

Further subject matter of the present invention relates to a method for manufacturing a nanotube-shaped structure exhibiting n-type semiconductive properties, comprising the step of forming a film of a nitrogenous compound directly on a nanotube-shaped structure exhibiting p-type semiconductive properties using a thermal CVD technique, at a temperature of the nanotube-shaped structure of 500° C. or higher and 1600° C. or lower. As a result, it is possible to obtain a nanotube-shaped structure exhibiting n-type semiconductive properties more easily than the prior art.

At this time, the step of forming the film of the nitrogenous compound is preferably performed under normal pressure).

The step of forming the film of the nitrogenous compound is preferably performed in an atmosphere of oxygen concentration of 1 volume % or less.

The step of forming the film of the nitrogenous compound is preferably performed in a reducing atmosphere.

Effect of the Invention

According to the n-type transistor of the present invention and the method for manufacturing a channel for the n-type transistor, it is possible to obtain a new n-type transistor different from the prior art.

According to the n-type transistor sensor of the present invention, it is possible to obtain a high sensitivity transistor sensor having the nanotube-shaped structure as an n-type channel.

Further, according to the method for manufacturing the nanotube-shaped structure exhibiting the n-type semiconductive properties of the present invention, it is possible to obtain the nanotube-shaped structure exhibiting the n-type semiconductive properties more easily than the prior art.

BRIEF DESCRIPTION OF THE DRAWINGS

FIG. 2 shows a method for manufacturing an n-type transistor according to one embodiment of the present invention, wherein

FIG. 4 explains a method for manufacturing a channel for an n-type transistor according to one embodiment of the present invention, wherein

FIG. 6 explains Example 1 of the present invention, wherein

Figure 1:
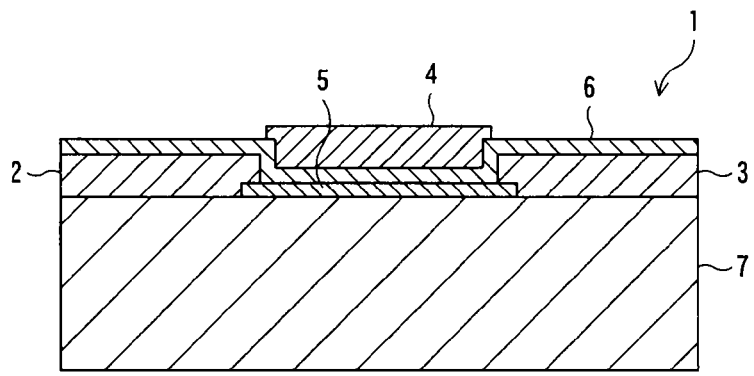
FIG. 1 is an exemplary cross sectional view schematically showing an n-type transistor according to one embodiment of the present invention.

EXPLANATION OF REFERENCE NUMERALS 1, 1', 1" N-type transistor
2 Source electrode
3 Drain electrode
4, 4' Gate electrode
5 Channel (nanotube-shaped structure, n-type channel)
5' Channel (nanotube-shaped structure, p-type channel)
6 Film of a nitrogenous compound
7 Substrate
8 Catalyst
9 Thermal CVD system
10 Furnace (quartz furnace)
11 Heater
12 Element
13 Substance to be detected (target object)
14 Specific substance
15, 15' n-type transistor sensor
16 Liquid stopper
17 Insulating film
18 Stage
19 Resist film
20 Hole
21 Well
22 Semiconductor parameter analyzer
23 Silver/silver chloride reference electrode

DETAILED DESCRIPTION OF THE PREFERRED EMBODIMENT

A preferred embodiment of the present invention will now be described. The present invention is not limited to the preferred embodiment below, and other combinations may arbitrarily be implemented without departing from the scope of the present invention.

[I. N-type Transistor]

FIG. 1 is an exemplary cross sectional view schematically showing an n-type transistor according to one embodiment of the present invention.

As shown in FIG. 1, an n-type transistor 1 of the present embodiment includes a source electrode 2, a drain electrode 3, a gate electrode 4, a channel 5 having a nanotube-shaped structure exhibiting the n-type semiconductive properties (hereinafter referred to as an "n-type channel"), and a film of a nitrogenous compound 6 which is formed directly on the n-type channel 5 (hereinafter referred to as a "nitrogenous compound film"). Generally, these components are formed on a substrate 7.

(1. Substrate)

Any arbitrary material may be used for forming the substrate 7, as long as it has insulating properties. Generally, an insulating substrate or insulated semiconductor substrate is used. Insulating properties means electrical insulating properties in the present specification, whereas an insulator means an electrical insulator, unless otherwise specified.

An insulating substrate is a substrate formed of an insulator.

Examples of the insulator for forming the insulating substrate are silicon oxide, silicon nitride, aluminum oxide, titanium oxide, calcium fluoride, acrylic resins, polyimide, Teflon (registered trademark), etc. One kind of insulator may be used singly, or two or more kinds of insulators may be used in arbitrary combination at an arbitrary rate.

The semiconductor substrate is formed of a semiconductor. Examples of this semiconductor for forming the semiconductor substrate are silicon, gallium arsenide, gallium nitride, zinc oxide, indium phosphor, silicon carbide, etc. One kind of semiconductor may be used singly, or two or more kinds of semiconductors may be used in arbitrary combination at an arbitrary rate.

The semiconductor substrate can arbitrarily be insulated. Generally, it is desirable that the semiconductor substrate is coated with an insulator so as to be insulated. If the semiconductor substrate is coated with an insulating film formed thereon, an example of the insulator for coating the substrate is the same as the insulator forming the above-described insulating substrate.

If an insulated semiconductor substrate is used as the substrate 7, this semiconductor substrate can operate as a gate electrode (back gate). If the insulated semiconductor substrate is used as the gate electrode, it is desirable that the substrate 7 has a low electrical resistance. For example, it is desirable that the semiconductor substrate uses a semiconductor to which a donor or acceptor is doped with a high concentration, and which shows metallic conductivity with a low electrical resistance.

Further, the shape of the substrate 7 is arbitrary, but it is generally made in a flat form. There is no particular limit in the size of the substrate, but the substrate 7 is preferably formed in 100 μm or greater so as to retain its mechanical strength. FIG. 1 shows an example wherein the insulating substrate is used as a substrate 1.

(2. Source Electrode and Drain Electrode)

There is no limit in the source electrode 2, as long as it can supply carrier of the n-type transistor 1 according to the present embodiment. There is no limit in the drain electrode 3, as long as it can receive the carriers of the n-type transistor 1 according to the present embodiment. Thus, a known source electrode 2 and a known drain electrode 3 can arbitrarily be used. If the n-type transistor 1 of the present embodiment is manufactured through a process of forming a nitrogenous compound film using a method for manufacturing a channel for the n-type transistor of the present invention as will be described later, they have preferably heat resistance to a temperature higher than a temperature condition at the formation of the nitrogenous compound film 6 using this manufacturing method. The source electrode 2 and the drain electrode 3 are generally formed on the same substrate 7.

The source electrode 2 and the drain electrode 3 can be formed of an arbitrary conductor, for example, gold, platinum, titanium, chromium, carbon, titanium carbide, tungsten, molybdenum, chromium silicide tungsten, tungsten nitride, polycrystalline silicon, etc. The source electrode 2 and drain electrode 3 may be formed of one single kind of conductor singly, or may be formed of two or more than two kinds of conductors in arbitrary combination at an arbitrary rate.

Further, the source electrode 2 and drain electrode 3 can be formed in arbitrary size and shape, using an arbitrary method. Note that the n-type transistor 1 of the present embodiment desirably has a sharp-ended part (a part connected to the channel), so as to improve its performance capabilities.

(3. Gate Electrode)

There is no limit in the gate electrode 4, as long as it can apply a gate voltage to the n-type channel 5 of the n-type transistor 1 of the present embodiment and is electrically insulated from the source electrode 2, the drain electrode 3 and the n-type channel 5. Any arbitrary gate electrode can be used, as long as it does not impair the effect of the present invention.

Therefore, the gate electrode 4 can be formed of an arbitrary conductor, for example, gold, platinum, titanium, titanium carbide, tungsten, silicide tungsten, tungsten nitride, aluminum, molybdenum, chromium, polycrystalline silicon, etc. The gate electrode 4 may be formed of one single kind of conductor singly, or can be formed of two or more than two kinds of conductors in arbitrary combination at an arbitrary rate.

The gate electrode 4 can be formed in arbitrary shape.

Further, the gate electrode 4 can be formed in an arbitrary position. Note that the gate electrode 4 is generally formed as any one of a back gate (the gate electrode fixed onto a surface opposite to the n-type channel 5), a side gate (the gate electrode 4 formed near and on the same surface as the n-type channel 5), and a top gate formed on the n-type channel 5 through the nitrogenous compound film 6.

Particularly, it is preferred the gate electrode 4 be formed as a top gate. The n-type transistor having a nanotube-shaped structure as the n-type channel 5 can be formed in accordance with simple manufacturing processes. Thus, in general, the gate electrode 4 is used as a back gate that applies a gate voltage from the back surface of the substrate 7. However, if two or more n-type transistors 1 are formed on the same substrate 7, the back gate type electrode simultaneously applies a gate voltage to all n-type transistors on the substrate 7. In consideration of the future integration, a top gate type n-type transistor is so required that can apply a voltage to each n-type channel 5 of the n-type transistor 1.

In the n-type transistor 1 of the present embodiment, the gate electrode 4 is formed as a top gate. In this configuration, the sensing capability can be improved, when the n-type transistor 1 of the present embodiment is used as a sensor. From this aspect, the gate electrode 4 is preferably formed as a top gate. To improve the sensing capability, a thin insulating film with high dielectric constants is used. As a result, the mutual conductance (the change rate of the drain current with respect to the gate voltage) improves, and it is possible to detect the potential change due to the density of the electrical charge on the surface of the gate insulating film. Therefore, it can be supposed that the improvement of the sensing capability can accordingly be attained. In FIG. 1, the gate electrode 4 is formed as a top gate.

If the n-type transistor 1 of the present embodiment is used as a sensor of, for example, an ion-sensitive field-effect transistor (ISFET), the n-type transistor 1 does not generally include the gate electrode 4, and a specimen liquid is in direct contact with the insulating film (e.g. the nitrogenous compound film 6, etc.) so as to apply a voltage to the n-type channel 5 through the specimen liquid using a reference electrode (not illustrated). This is because if the specimen is in contact with an element (the gate electrode 4 in this case) which is formed with a material (e.g. metal, etc.) having a high free electron density, the sensing capability can not sufficiently be exhibited.

The gate electrode 4 can be formed before or after the formation of the nitrogenous compound film 6. However, if the gate electrode 4 is formed as a top gate or back gate, the gate electrode is preferably formed generally after the formation of the n-type channel 5 and nitrogenous compound film 6. If the gate electrode 4 is formed as a side gate, the gate electrode is preferably formed generally before the formation of the channel (both p-type and n-type) 5 and the nitrogenous compound film 6. This is to simply conduct the formation of the gate electrode 4.

Further, the gate electrode 4 can be formed in arbitrary size and shape. Note, however, that the gate electrode 4 is preferably arranged in a position near the n-type channel 5 as much as possible.

One or two or more gate electrodes 4 may be formed. Therefore, the gate electrode 4 can be formed for example in combination of two or more of the top gate, the side gate and the back gate.

The gate electrode 4 can be formed using an arbitrary method. Generally, the gate electrode 4 is patterned using a photolithography technique.

(4. N-type Cannel)

Generally, the channel is provided between the source electrode 2 and the drain electrode 3 so as to be a current path therebetween. The n-type transistor 1 of the present embodiment includes the n-type channel 5 having a nanotube-shaped structure exhibiting n-type semiconductive properties. In this case, the nanotube-shaped structure is a nano-scale tube-shaped structure. Generally, the cross-sectional diameter orthogonal to its longitudinal direction is 0.4 nm or more and 50 nm or less.

The nanotube-shaped structure can be used as a charge carrier having a one-dimensional quantum wire structure that is a few nanometers in diameter. Thus, if this structure is used in the n-type channel 5 of the n-type transistor 1, the gate capacity is remarkably decreased as compared to the conventional transistor. Thus, if the n-type transistor 1 of the present embodiment is applied into the sensor (such as an n-type transistor sensor of the present invention, as will be described later), a very large change occurs in the gate voltage due to the interaction between a specific substance and a target substance to be detected. This results in a remarkably large change in the density of charged particles existing in the n-type channel 5.

Examples of the nanotube-shaped structure are a carbon nanotube, a boron nitride nanotube, a titania nanotube, etc. According to the conventional technique, it is difficult to form a channel in the 10 nm grade, even using a semiconductor fine processing technique. However, the use of the nanotube-shaped structure enables to form the n-type channel 5 which is finer than the conventional channel.

There is no limit in the particular shape of the nanotube-shaped structure. In one given example of the structure's shape, the ratio of the length in the longitudinal direction of the structure to the length in one longest direction among directions perpendicular to the longitudinal direction is in a range of 10 or more and 10,000 or less. Further, examples include a rod-shaped structure (approximately circular in cross section) and a ribbon-shaped structure (approximately square in cross section), etc.

Further, the n-type channel 5 is preferably formed loosely between the source electrode 2 and the drain electrode 3 at room temperature. This enables to lower the possibility of damaging the n-type channel 5 due to temperature change.

The number of the n-type channel (s) 5 is arbitrary. One or two or more n-type channels can be formed. Further, the n-type channel 5 can be formed in combination with a p-type channel.

In the n-type transistor 1 of the present embodiment, the n-type channel 5 exhibits n-type semiconductive properties. Whether the n-type channel 5 exhibits n-type semiconductive characteristics can be confirmed based on determination as to whether the drain current flowing through the channel 5 increases or decreases in accordance with an increase in the gate voltage. This determination is made particularly when the gate voltage is applied as it is swept from −5 V to +5 V in an atmosphere at room temperature, and when the drain voltage of 0.1 V is applied between the source electrode 2 and the drain electrode 3. Specifically, as a result of the above operation, it can be confirmed that the channel 5 exhibits the n-type semiconductive properties, if the drain current increases. On the contrary, the channel 5 exhibits the p-type semiconductor properties, if the drain current decreases.

With the n-type channel 5 exhibiting the n-type semiconductive properties, the n-type transistor 1 of the present embodiment can form a complementary circuit in combination with the p-type transistor using a channel exhibiting the p-type semiconductive properties. This complementary circuit has excellent energy efficiency, thus is indispensable for circuit integration with low power consumption. Further, combining an n-type channel and a p-type channel can form a p-n junction (diode).

Generally, transistors can be grouped into two, i.e. field-effect transistors (FETs) and single-electron transistors (SETs), in accordance with the channel (including the n-type channel 5) structure. The difference of the two resides in whether the channel has a quantum dot structure. Specifically, transistors whose channel does not have a quantum dot structure are field-effect transistors, while transistors whose channel has a quantum dot structure are single-electron transistors. When forming the n-type channel 5, it is preferable to select the n-type channel 5 to be formed, in accordance with whether the n-type transistor 1 of the present embodiment is a field-effect transistor or single-electron transistor.

Descriptions will now be made to a channel of the field-effect transistor (hereinafter referred to as an "FET channel") and a channel of the single-electron transistor (hereinafter referred to as a "SET channel"). When the FET channel and the SET channel are not distinguished, they are simply called "channel". As described above, the field-effect transistor and the single-electron transistor can be distinguished based on their channel. Thus, the transistor having the FET channel should be identified as a field-effect transistor, while the transistor having the SET channel should be identified as a single-electron transistor.

The FET channel can operate as a current path in the field-effect transistor.

The nanotube-shaped structure exhibits both the semiconductive electrical properties and the metallic electrical properties in accordance with its chirality. If an FET channel is used as the n-type channel of the n-type transistor of the present embodiment, the nanotube-shaped structure desirably has semiconductive properties as its electrical properties. Examples of methods for confirming whether the nanotube-shaped structure have metallic or semiconductive properties are: a method for confirming the properties by determining the chirality of the carbon nanotube using Raman spectroscopy; and a method for confirming the properties by measuring the density of an electronic state of the carbon nanotube using scanning tunneling microscope (STM) spectroscopy.

Like the FET channel, the SET channel can operate as a current path in the single-electron transistor.

Unlike the FET channel, the SET channel has a quantum dot structure. Thus, the SET channel is formed of a substance having a quantum dot structure. Of the nanotube-shaped structures, one having a quantum dot structure is used for forming the SET channel. For example, a carbon nanotube having defects introduced therein can be used as a SET channel. Specifically, the SET channel can be formed by a carbon nanotube having a quantum dot structure of generally 0.1 nm or more and 50 nm or less between defects.

There is no limit in the carbon nanotube having the above-described quantum dot structure, and any arbitrary carbon nanotube can be used as long as it does not impair the effect of the present invention. For example, a carbon nanotube having no defects therein is heated in an atmosphere gas of hydrogen, oxygen, argon or the like, or is chemically-treated such as to be boiled in an acid solution, thereby forming a carbon nanotube having defects introduced therein.

The defects are formed in the nanotube-shaped structure, thereby forming a quantum dot structure wherein areas between the defects are several nanometers in size and also reducing the gate capacity. A coulomb blockade phenomenon occurs in the nanotube-shaped structure having the quantum dot structure. In this phenomenon, an inflow of electrons into the quantum dot structure is restricted. Thus, such a nanotube-shaped structure is used as the n-type channel so as to realize a single electron transistor.

Another difference between the SET channel and the FET channels is that the nanotube-shaped structure preferably has metallic properties as its electrical properties, when it is used as SET channels. The method for confirming whether the nanotube-shaped structure is metallic or semiconductive may be the same as the above-described method described in the description of the FET channel.

(5. Nitrogenous Compound Film)

The nitrogenous compound film 6 is a film of a nitrogenous compound and is formed directly on the n-type channel 5.

There is no limit in the nitrogenous compound forming the nitrogenous compound film 6, as long as it is an insulating compound containing nitrogen. Any arbitrary nitrogenous compound can be used, as long as it does not impair the effect of the present invention. For example, boron nitride, aluminum nitride, and silicon nitride can be used. Among them, silicon nitride is preferable. One single kind of nitrogenous compound can be used, or two or more kinds of nitrogenous compounds can be used in arbitrary combination at an arbitrary rate.

From an aspect of higher performance of the n-type transistor 1, the nitrogenous compound film 6 is preferably formed of a material with as high a dielectric constant as possible. Specifically, it is desirable that its dielectric constant be generally 3 or greater, preferably 7 or greater. As a result, the nitrogenous compound film 6 can operate as an insulating layer.

There is no limit in the thickness of the nitrogenous compound film 6. The thickness of the film is arbitrary, as long as it does not remarkably impair the effect of the present invention. For higher performance of the n-type transistor 1, however, the nitrogenous compound film 6 on the channel is desirably made thin to an extent that the leakage current is negligible. Note, however, that if the film is made too thin, the leakage current remarkably may increase due to a tunnel current or the like. Therefore, the thickness of the nitrogenous compound film is generally desirably 0.5 nm or greater, preferably 1 nm or greater, and more preferably 2 nm or greater.

Further, the nitrogenous compound film 6 is formed directly on the surface of the n-type channel 5, not through any other film. In this case, the film 6 only has to be formed on at least a part of the surface of the n-type channel 5. However, it is more preferred that the nitrogenous compound film 6 be formed directly over the entire surface of the n-type channel 5. According to this structure, the n-type channel 5 is protected from oxygen so as to form a stable n-type channel.

If the nitrogenous compound film 6 is formed through a later-described nitrogenous compound film forming process, the nitrogenous compound film 6 to be formed is generally formed only on the upper and side parts of the n-type channel 5 but not on its lower part. That is, if the nitrogenous compound film is formed using a thermal CVD (thermal chemical vapor deposition) technique, a nitrogenous compound is deposited so as to form the nitrogenous compound film 6. As a result, the nitrogenous compound is not deposited on the lower part of the n-type channel 5 because the n-type channel blocks. Even in this case, because the nitrogenous compound film 6 can protect the n-type channel 5 from oxygen, the semiconductive properties of the n-type channel 5 can be retained as "n-type".

The nitrogenous compound film 6 can be formed as a part of or entire surface of the source electrode 2 or drain electrode 3, as an insulating film thereof.

The nitrogenous compound film 6 may contain any substance other than a nitrogenous compound. Examples of such a substance are carbon, hydrogen, ammonia, chlorine, oxygen, argon, helium, etc. An advantage of containing any of the above substances is that the dielectric constant of the nitrogenous compound film 6 can be controlled. The nitrogenous compound film 6 is preferably formed of mainly a nitrogenous component. Specifically, the nitrogenous compound film 6 contains generally a 50 atomic % nitrogenous component, preferably an 80 atomic % or greater nitrogenous component, and more preferably a 90 atomic % or greater nitrogenous component. The upper limit of the containment is arbitrary, but should logically be 100 atomic % or less.

Particularly, the nitrogenous compound film 6 has an oxygen content of generally 10 atomic % or less, preferably 8 atomic % or less, and more preferably 7 atomic % or less. If the nitrogenous compound film 6 has a too high oxygen content, oxygen has an effect on conductivity of the nanotube. Thus, it may be difficult to control the conductivity. The lower limit of the oxygen content of the nitrogenous compound film 6 is logically 0 atomic %, but generally 1 atomic % or greater. Such a nitrogenous compound film 6 having a low oxygen content can be obtained when the nitrogenous compound film 6 is formed through a later-described nitrogenous component forming process.

The nitrogenous compound film 6 has a hydrogen content of generally 5 atomic % or greater, preferably 7 atomic % or greater, and more preferably 8 atomic % or greater, and further generally 20 atomic % or less, preferably 15 atomic %, and more preferably 10 atomic % or less. If the nitrogenous compound film 6 has a too low hydrogen content, it may be difficult to suppress an effect of oxygen on conductivity of the nanotube due to the reduction effect of hydrogen. On the other hand, if the nitrogenous compound film 6 has a too high hydrogen content, a stress within the nitrogenous compound film 6 increases. This may result in separation of the film. The nitrogenous compound film containing hydrogen in the above-described range can be obtained through a later-described nitrogenous compound film forming process.

Further, the nitrogenous compound film 6 has insulating properties, and thus can be used as an insulating film, thereby preventing a short-circuit as a result of the n-type channel 5 being in contact with the top gate 4 or wiring.

The nitrogenous compound film 6 can arbitrarily be formed not only on the surface of the n-type channel 5, but also on the surface of the substrate 7, source electrode 2, drain electrode 3 and gate electrode 4, as long as it does not remarkably impair the effect of the present invention.

(6. Other Members)

The n-type transistor 1 of the present invention may include any member (s) or film (s) other than the above source electrode 2, the drain electrode 3, the gate electrode 4, the n-type channel 5 and the nitrogenous compound film 6.

For example, any other insulating film may be formed on the surface of the substrate 7 or the surface of the nitrogenous compound film 6. Such an insulating film is to protect the channel 5 or each electrode 2, 3 and 4, and is to allow a current to securely flow by the channel 5. This insulating film can be formed of an arbitrary insulating material of a high molecular material, such as photoresist (photosensitive resins), acrylic resins, epoxy resins, polyimide, Teflon (registered trademark), etc., a self-assembled film such as aminopropylethoxy silane, etc., a lubricant such as PER-fluoropolyether, Fomblin (trade name) etc., an inorganic materials such as a fullerenes compound, or silicon oxide, fluosilicate glass, HSQ (Hydrogen Silsesquioxane), MLQ (Methyl Lisesquioxane), porous silica, silicon nitride, aluminum oxide, titanium oxide, calcium fluoride, a diamond thin film, etc. One single kind of the above materials can be used, or two or more kinds of the above materials can be used in arbitrary combination at an arbitrary rate.

(7. Effect)

According to the n-type transistor 1 of the present embodiment, a new n-type transistor can be provided using a nanotube-shaped structure as the n-type channel 5.

The n-type transistor 1 of the present embodiment is stable in the air. Thus, the n-type channel 5 can be controlled not to exhibit P-type semiconductive properties due to oxygen in the air with the passage of time. Meanwhile, "stable in the air" means that the back gate is formed and the channel still exhibits n-type semiconductive properties, even after the nitrogenous compound film 6 is formed and left in the air at a temperature of 26° C. and 26% relative humidity for generally one week or longer, preferably one month or longer, and more preferably one year or longer and further more preferably ten years or longer.

Further, the n-type transistor of the present embodiment has higher heat resistance than conventional transistors. Conventionally, when the n-type transistor is made using organic molecules or solid electrolytes, such an n-type transistors does not have sufficient high heat resistance, because the organic molecules and solid electrolytes do not have high heat resistance. However, in the n-type transistor 1 of the present embodiment, the nitrogenous compound such as silicon nitride, etc. covering the surface of the n-type channel has high heat resistance, thus achieving high heat resistance, for example, up to 1200° C.

In the n-type transistor 1 of the present embodiment, then-type channel 5 is protected using the nitrogenous compound film 6 formed of a nitrogenous compound, without using a conventionally-used protective film containing oxygen. Thus, various advantages can thus be attained.

For example, the nitrogenous compound film 6 does not contain oxygen or contains oxygen of only a predetermined level or less. This results in an advantage that the n-type semiconductive properties of the n-type channel 5 can stably be maintained. According to the above excellent technique, many advantages can be attained by forming the n-type transistor 1 of the present embodiment with: the source electrode 2; the drain electrode 3; the gate electrode 4; the n-type channel 5 having the nanotube-shaped structure arranged between the source electrode 2 and the drain electrode 3; and the insulating film (i.e. the nitrogenous compound film) 6 formed directly on the channel 5 and containing oxygen of only a predetermined level or less.

(II. Manufacturing Method)

The method for manufacturing the channel for the n-type transistor of the present invention includes a process of forming a nitrogenous compound film directly on the nanotube-shaped structure as a channel exhibiting p-type semiconductive properties under predetermined conditions using a thermal CVD technique (a nitrogenous compound film forming process). As a result, the nanotube-shaped structure exhibiting the p-type semiconductive properties is changed to exhibit the n-type semiconductive properties. In addition, the nitrogenous compound film according to the present invention is formed on the surface of the nanotube-shaped structure, thereby obtaining a channel for an n-type transistor.

By going through the above-described nitrogenous compound film forming process, a transistor having an n-type channel can be manufactured, using the transistor having the nanotube-shaped structure having the p-type semiconductive properties or an element halfway through the manufacture (such as the substrate having any one of the source electrode, the drain electrode and the gate electrode). This method is hereinafter called a "method for manufacturing an n-type transistor of the present invention".

Descriptions will now be made to an embodiment for explaining the method for manufacturing the channel for the n-type transistor and the n-type transistor of the present invention.

[1. Preparation of p-type Channel]

To manufacture an n-type transistor of the present embodiment, prepared is a transistor having a channel (hereinafter referred to as a "p-type channel") having a nanotube-shaped structure exhibiting p-type semiconductive properties, or an element(s) halfway through the manufacture. The specific method for manufacturing the transistor is arbitrary. For example, when a carbon nanotube is used as a nanotube-shaped structure forming a p-type channel, it can be prepared in accordance with the following processes.

[1-1. Formation of p-type Channel]

Figure 2A:
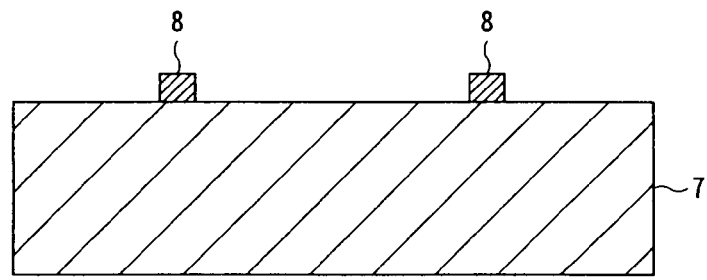
FIG. 2(a) and FIG. 2(b) are exemplary cross sectional views each for explaining an operation in each process of a method for manufacturing a channel using a carbon nanotube.
Figure 2B:
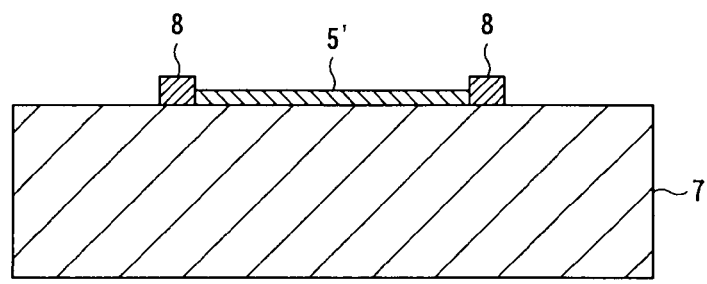

FIG. 2(a) and FIG. 2(b) are exemplary cross sectional views for explaining an operation in each process of a method for manufacturing a channel using a carbon nanotube. The same reference numerals are employed in FIG. 2(a) and FIG. 2(b) to identify the substantially same features in FIG. 1.

There is no limit in the method for forming the channel. The position and direction of the carbon nanotube used as the n-type channel 5 are generally controlled. Thus, the carbon nanotube is formed by controlling the growth position and direction thereof, generally using catalysts (growth catalysts) 8 patterned through a photolithography technique. Specifically, for example, the p-type channel having the carbon nanotube can be formed through the following processes (1) to (4). In FIG. 2(a) and FIG. 2(b), the p-type channel and the carbon nanotube represent the same feature, thus are identified by the same reference numeral, 5'.

Process (1): patterning the photoresist (not illustrated) on the substrate 7.

Process (2): depositing metallic catalysts 8.

Process (3): conducting liftoff so as to form a pattern of the catalysts 8 {FIG. 2(a)}.

Process (4): making a source gas to flow so as to form a carbon nanotube 5' between the catalysts 8 {FIG. 2(b)} using a thermal CVD technique.

The below describes each of the processes.

In Process (1), a pattern to be formed is determined in accordance with a target position and direction for forming the carbon nanotube 5'. Patterning is performed on the substrate 7 using photoresist in conformity with the pattern.

In Process (2), a metal to be the catalysts 8 is deposited on the surface of the patterned substrate 7. Examples of the metal to be the catalysts 8 are transition metal, such as iron, nickel, cobalt, etc., or their alloys.

Subsequently, in Process (3), as shown in FIG. 2(a), after the deposition of the catalysts 8, liftoff is performed. As a result of the liftoff, because the photoresist is removed from the substrate 7, the catalysts deposited on the photoresist surface are removed therefrom as well. As a result, the pattern of the catalysts 8 is formed in conformity with the pattern formed in Process (1).

Finally, in Process (4), as shown in FIG. 2(b), a source gas for the nanotube (e.g. methane gas, alcohol gas, etc.) is made to flow at a high temperature in a CVD furnace so as to form the carbon nanotube 5' between the catalysts 8. At a high temperature, the catalysts 8 become particles of a few nm in diameter, and the carbon nanotube 5' grows with a core of the particles. In this case, the high temperature represents a temperature range of 300° C. or higher and 1200° C. or lower.

As described above, the carbon nanotube 5' can be formed in accordance with Processes (1) to (4).

When the n-type transistor 1 of the present embodiment is manufactured as a single-electron transistor, defects may be introduced into the carbon nanotube 5' through a following oxidation process so as to form quantum dots. As a result, the SET channel can be formed.

At this stage, the thus formed carbon nanotube 5' is to operate generally as a p-type channel 5' exhibiting p-type semiconductive properties, when used as a channel.

[1-2. Formation of Source/Drain Electrodes]

Figure 3:
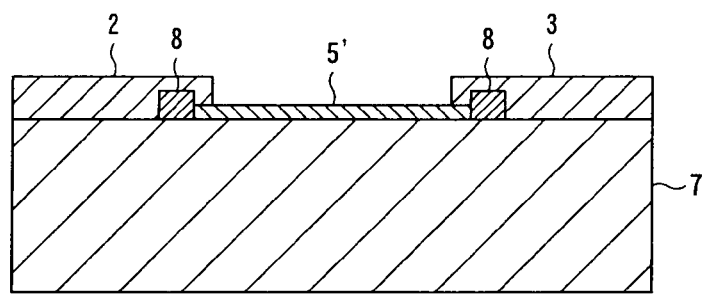
FIG. 3 is an exemplary cross sectional view for explaining a method for manufacturing the n-type transistor according to the embodiment, and for explaining the state of forming a source electrode and a drain electrode.

As shown in FIG. 3, a source electrode 2 and a drain electrode 3 are formed at both ends of the carbon nanotube 5', using ohmic electrodes, etc.

The source electrode 2 or drain electrode 3 can be formed arbitrarily using the known manufacturing method, but generally a photolithography technique is used. In this case, the source electrode 2 and the drain electrode 3 can be provided at the end or on the side surface of the carbon nanotube 5'. At the time of forming the source electrode 2 or drain electrode 3, heat treatment in a range of 300° C. or higher and 1000° C. or lower can be conducted for the purpose of better electrical connection.

FIG. 3 is an exemplary cross sectional view for explaining the method for manufacturing the n-type transistor of the present embodiment and for explaining the state of forming the source electrode and the drain electrode. The same reference numerals are employed in FIG. 3 to identify the substantive same features in FIG. 1, FIG. 2(a) and FIG. 2(b).

[1-3. Formation of Gate Electrode]

A gate electrode 4 is formed before or after a later-described nitrogenous compound film forming process. A method for forming the gate electrode 4 is arbitrary. For example, the gate electrode 4 can be formed in accordance with the same formation method as that for the source electrode 2 or drain electrode 3.

[2. Nitrogenous Compound Film Forming Process]

In a nitrogenous compound film forming process, a nitrogenous compound film 6 is formed directly on the surface of a prepared p-type channel 5', under a predetermined condition with a source gas of a nitrogenous compound, using a thermal CVD technique, thereby obtaining an n-type channel 5 exhibiting n-type semiconductive properties (i.e. a nanotube-shaped structure exhibiting n-type semiconductive properties).

The p-type channel 5' for forming the nitrogenous compound film 6 may be in the form of an element including only the p-type channel 5' formed on the substrate 7, or may be in the form of an element on which one or both of the source electrode 2 and the drain electrode 3 is or are formed, or further may be in the form of an element (i.e. a p-type transistor) including the p-type channel 5', the source electrode 2, the drain electrode 3 and the gate electrode 4. Generally, the nitrogenous compound film 6 is formed onto an element, which includes the substrate 7 on which the p-type channel 5' is formed, and includes also the source electrode 2 and the drain electrode 3 both of which are formed on both sides of the channel 5'. The other element on which the film 6 is formed includes the p-type channel 5', the source electrode 2, the drain electrode 3 and the gate electrode 4 which are formed on the substrate 7.

In the present embodiment, when forming the nitrogenous compound film 6, an inert atmosphere or reducing atmosphere is prepared in the system. Reducing atmosphere is preferred. Oxygen release is accelerated in the p-type channel 5', thereby stably changing the semiconductive properties of the p-type channel 5' into the n-type semiconductive properties.

A specific atmospheric condition may be approximately set in accordance with the kind or composition of the nitrogenous compound film 6. Specifically, the oxygen concentration in the system is generally 1 volume % or less, preferably 0.01 volume % or less, and more preferably 0.001 volume % or less. If the oxygen concentration exceeds the upper limit of this range, the p-type channel 5' or n-type channel 5 may be damaged by oxygen, or the p-type channel 5' may not become an n-type channel 5. Though there is no lower limit of the concentration, it is logically 0 volume %.

A gas as a source (hereinafter referred to as a "source gas") of the nitrogenous compound is fully contained or made to flow inside the system, at the time of forming the nitrogenous compound film 6, in the generally used thermal CVD technique. In the system, a vapor phase chemical reaction (thermal decomposition, reduction, substitution reaction, etc.) with source gases occurs on the surface of the substrate, thereby showing a reaction of generating a nitrogenous compound. Thus, according to the thermal CVD technique, a source gas, an inert gas, a reducing gas, a carrier gas, and the like appropriately used are fully contained or made to flow inside the system, at the time of forming the nitrogenous compound film 6. As a result, the above-described oxygen concentration or lower can be attained in the atmosphere of the system, without any special control. Therefore, as described, the oxygen concentration within the atmosphere is controlled to attain an inert atmosphere or reducing atmosphere. This is desirably performed generally in a temperature adjusting process before or after the formation of the nitrogenous compound film 6 (i.e. a temperature increasing process and a temperature decreasing process), if the thermal CVD technique is used.

Further, at the time of forming the nitrogenous compound film 6, it is preferred to set the temperature of the target p-type channel 5', on which the nitrogenous compound film 6 is to be formed, generally at 500° C. or greater and more preferably 700° C. or greater, generally 1600° C. or lower, preferably 1000° C. or lower and more preferably 900° C. or lower. If the temperature is not within this range, a good nitrogenous compound film 6 may not be formed. Though the temperature of the above-described p-type channel 5' is equal to that of the substrate 7 on which the p-type channel 5' is formed, the temperature of this substrate 7 generally only has to be within the above range.

Further, reaction conditions at the time of forming the nitrogenous compound film 6 are arbitrary as long as they do not remarkably impair the effect of the present invention.

For example, an inert gas or reducing gas may be fully contained or flow inside the system. As a result, the oxygen concentration securely decreases, thereby securely attaining an inert atmosphere or reducing atmosphere inside the system for forming the nitrogenous compound film 6. Examples of the inert gas are nitrogen, helium, neon, argon and krypton, while an example of the reducing gas is hydrogen.

The pressure conditions are arbitrary as long as they do not remarkably impair the effect of the present invention, and are conducted generally under normal pressure or reduced pressure, generally 1 Pa or greater and preferably 10 Pa or greater, and generally 1.013 MPa or lower and preferably 1 kPa or lower. If the pressure conditions are set within this range, the mean free path of the source gas becomes longer, thus easily attaining a uniform film. If the reduced pressure is set as the pressure condition, the external air (generally the air) enters from the outside of the furnace used in the thermal CVD technique. As a result, oxygen exists in the atmosphere inside the furnace so that the semiconductive properties of the p-type channel 5' may not be changed to the n-type properties. Therefore, the normal pressure should preferably be set as the pressure condition.

To form the nitrogenous compound film 6 directly on the surface of the p-type channel 5', materials of the nitrogenous compound exist in a gaseous state in the system that is set in the above conditions. The materials (hereinafter referred to as "source gas") are made to react on the element surface including the surface of the p-type channel 5' so as to form the nitrogenous compound film 6 of the present embodiment directly on the surface of the p-type channel 5'. Once the nitrogenous compound film 6 is thus formed on the surface, the p-type channel 5' will become a channel for an n-type transistor (an n-type channel) 5 exhibiting the n-type semiconductive properties. This method is performed using the thermal CVD technique, as described above.

There is no limit in the source gas of the nitrogenous compound. Any arbitrary source gas can be used as long as it can form the nitrogenous compound film 6 through the reaction on the surface of the p-type channel 5' in the above-described environment. Generally, the system includes both a source compound containing nitrogen and another source compound containing atoms forming the nitrogenous compound with nitrogen.

The source compound containing nitrogen is selected in accordance with a nitrogenous compound forming the nitrogenous compound film 6. Examples of the source compound are ammonia, nitrogen, etc. Nitrogen can work also as an inert gas. One kind of the above can be used singly, or two or more kinds of the above materials can be used in arbitrary combination at an arbitrary rate.

The source compound containing atoms forming the nitrogenous compound with nitrogen is also selected in accordance with the nitrogenous compound forming the nitrogenous compound film 6. Examples of this source compound are mono-silane, dichlorosilane, silicon tetrachloride, dimethyldichlorosilane, boron trichloride, aluminum trichloride, etc. One kind of the above can be used singly, or two or more kinds of the above materials can be used in arbitrary combination at an arbitrary rate.

Any gas can be introduced into the system other than the above-described inert gas, reducing gas and source gas, as long as it does not remarkably impair the effect of the present invention. For example, a carrier gas can be introduced into the system, as long as it does not remarkably impair the effect of the present invention. A carrier gas is made to flow together with the source gas at the time of film formation, and is used to introduce the source gas into the system at the time of film formation. This carrier gas may, for example, be the above-described inert gas, reducing gas, or may be the same as their combination.

The carrier gas has various functions, depending on its type. In addition to the function for introducing the source gas into the system at the time of film formation, a hydrogen gas has a function for decomposing the source gas containing chlorides, due to the reducing reaction expressed by the following reaction formula. It is supposed that a hydrogen gas has a function for removing oxygen existing on the channel.

$SiCl_4 + 2H_2 \rightarrow Si + 4HCl$

Further, the carrier gas has a function for vaporizing and transporting raw liquid, by conducting bubbling as a result of leading the carrier gas to raw liquid that cannot easily be vaporized. For example, if silicon tetrachloride in a liquid state is bubbled with the carrier gas, vaporization of silicon tetrachloride can be enhanced.

As described, if a chloride-based source gas or the like is used, the reducing gas is used as a carrier gas. This may result in smooth progress of film formation.

There are some examples of the source gas or carrier gas used for film formation. For example, when the nitrogenous compound film 6 is formed with silicon nitride, examples of the source gas or carrier gas are: "a combination of monosilane, ammonia, and nitrogen"; "a combination of monosilane, ammonia, nitrogen and hydrogen (note that it is supposed that nitrogen and hydrogen function as carrier gases)"; "a combination of dichlorosilane and ammonia"; and "a combination of silicon tetrachloride, nitrogen and hydrogen (note that it is supposed that nitrogen functions as a source gas and carrier gas, while hydrogen functions as a carrier gas)".

Figure 4A:
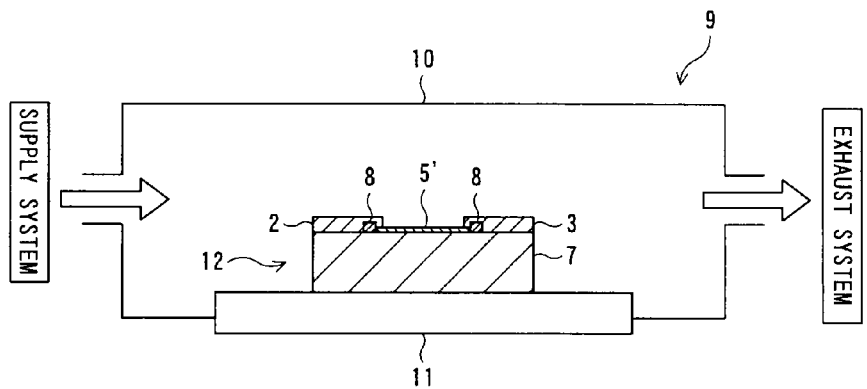
FIG. 4(a) and FIG. 4(b) are exemplary schematic diagrams for explaining the state of forming a nitrogenous compound film using an atmospheric pressure thermal CVD system as an example of a device used for forming a nitrogenous compound film using a thermal CVD technique.
Figure 4B:
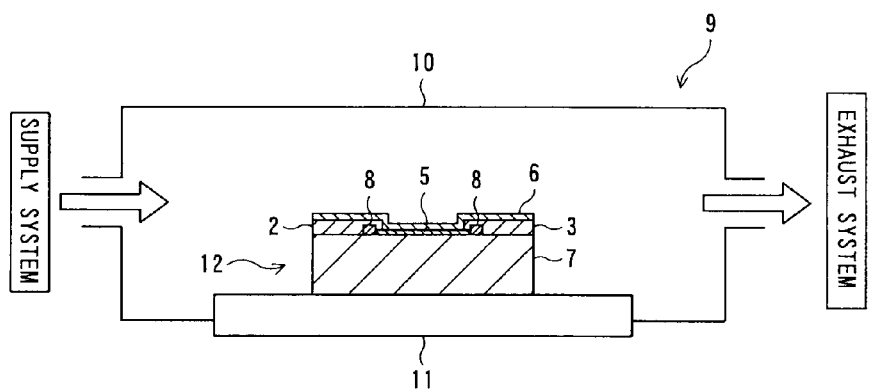

Specific descriptions will now be made to a thermal CVD technique generally used in this process, with reference to the drawings. FIG. 4(a) and FIG. 4(b) are exemplary schematic diagrams for explaining a state of the thermal CVD at the time of forming the nitrogenous compound film 6 using an atmospheric pressure thermal CVD system as an example of a system for forming the nitrogenous compound film 6 using the thermal CVD technique. Note, however, that FIG. 4(a) and FIG. 4(b) show only an example of the system and don't intend to limit the present invention, and the configuration of FIG. 4(a) and FIG. 4(b) can arbitrarily be changed as long as the changes do not remarkably impair the effect of the present invention. Further, the same reference numerals are employed in FIG. 4(a) and FIG. 4(b) to identify the substantially same features in FIG. 1 to FIG. 3. FIG. 4(a) shows the state of the element before the formation of the nitrogenous compound film 6, while FIG. 4(b) shows the state of the element after the formation of the nitrogenous compound film 6.

A thermal CVD system 9 shown in FIG. 4(a) includes a furnace 10, forming the system for forming the nitrogenous compound film 6, and a heater 11. A source gas, an appropriately-used inert gas, a reducing gas, a carrier gas, etc. are supplied into the internal system of furnace 10 from a supply system. In addition, a gas of the inner system of the furnace 10 is exhausted from an exhaust system. In this case, the furnace 10 has a system for forming the nitrogenous compound film 6, in its inside. The heater 11 is to heat the inside of the furnace 10.

When the nitrogenous compound film forming process is conducted using such a thermal CVD system 9, a target element 12 on which the nitrogenous compound film 6 is formed is provided inside the furnace 10. In addition, an inert gas or reducing gas is introduced into the furnace 10 so as to attain an inert atmosphere or reducing atmosphere inside the furnace 10. The temperature of the furnace 10 is adjusted to meet above-described temperature conditions. This process is generally a temperature increasing process of heating the inside of the furnace 10. At this time, it is desirable that a low oxygen concentration be realized as described above. In the configuration of FIG. 4(a) and FIG. 4(b), the employed element 12 includes the substrate 7, the p-type channel 5' formed on the substrate 7, the source electrode 2 and the drain electrode 3 both of which are formed at both ends of the channel 5'.

If the temperature of the furnace 10 satisfies the above temperature conditions, a source gas and an approximately-used inert gas, reducing gas, carrier gas are supplied from the supply system. As a result, as shown in FIG. 4(b), the source gas is decomposed by heat, reacts on the surface of the element 12, thereby forming the nitrogenous compound film 6 on the surface of the element 12 (including the surface of the channel 5). Having formed the above-described nitrogenous compound film 6, the p-type channel 5' formed in the element 12 is changed to exhibit the n-type semiconductive properties, thereby obtaining an n-type channel 5. In this process of forming the nitrogenous compound film 6, in order to supply the above-described source gas into the system, the oxygen concentration in the system can generally stay within the above range without any special control.

When the nitrogenous compound film 6 is made to have a desired thickness, the source gas stops to be supplied. After cooling, the element 12 is removed from the furnace 10. Even at this cooling (temperature decreasing process), the atmosphere should be made as an inert atmosphere or reducing atmosphere. Therefore, in the temperature decreasing process, it is desirable that the cooling should be implemented, while the inert gas or reducing gas is made to flow. If the cooling is implemented with a flow of the inert gas or reducing gas, the cooling-down can rapidly be achieved.

When the thermal CVD technique is used, the nitrogenous compound film 6 can thus be formed.

When the nitrogenous compound film 6 is formed while the source gas is made to flow in the system, as described above, the flow rate of the source compound and the concentration and composition of the source gas to be supplied are all arbitrary, as long as they do not remarkably impair the effect of the present invention.

Note, however, that the nitrogenous compound film 6 is formed, if a source gas exists under the above temperature and oxygen concentration conditions. When the source gas is not supplied from the outside, like the system 9 of FIG. 4(a) and FIG. 4(b), the nitrogenous compound film 6 can be formed. For example, the film formation can be implemented, after the system is closed. When the source gas is not supplied from the outside, specific reaction conditions (such as the concentration and composition of the source gas etc.) are all arbitrary, as long as they do not remarkably impair the effect of the present invention.

The thermal CVD technique can be found by reference to following documents 1 and 2.

Document 1: Tateo Asamaki, The Nikkan Kogyo Shimbun Ltd., "Bisai-kako no Kiso-Denshi Device Process Gijutsu (Fundamentals of Microfabrication-Electronic Device Process Technology), $2^{nd}$ edition", ISBN4-526-04812-7

Document 2: K. L. Choy: Progress in Materials Science, 48 (2003) 57-170, Chemical vapor deposition of coatings.

[3. Other Processes]

After the formation of the nitrogenous compound film 6, other processes can appropriately be conducted for the element (including the transistor) 12.

For example, the formed nitrogenous compound film 6 can be etched. In this case, the etching is conducted for the purpose of connecting the voltage applying wiring to the electrodes 2 and 3 below the nitrogenous compound film 6, or for the patterning purpose. In this case, the known etching techniques, such as wet etching, reactive ion etching (RIE), etc. can arbitrarily be employed. A known etchant can arbitrarily be used for the wet etching and RIE.

[4. Effect]

According to the above-described method of the present invention (i.e. the method for manufacturing the channel for the n-type transistor of the present invention or the method for manufacturing the n-type transistor of the present invention), a channel for new n-type transistors using a nanotube-shaped structure can easily be obtained as compared to the prior art. In addition, a new n-type transistor using a channel having a nanotube-shaped structure can easily be obtained as compared to the prior art. This is because the manufacturing method of the present invention includes the nitrogenous compound film forming process.

Especially, as compared to the prior art for obtaining the n-type channel by implementing the doping or removing oxygen so as to form a protective film, the n-type channel 5 having the nanotube-shaped structure can be attained simply by forming the nitrogenous compound film 6 without implementing the doping or removing of oxygen, according to the above-described method of the present invention. That is, it is possible to obtain the n-type transistor 1 and the channel 5 for n-type transistors using the channel having the nanotube-shaped structure, through fewer processes than the prior art. Therefore, according to the above method of the present invention, mass production of the n-type transistor 1 and n-type channel 5 can be improved.

Surprisingly, by forming the nitrogenous compound film 6 directly on the surface of the p-type channel 5' with the existence of the source gas under the above-described predetermined conditions, the semiconductive properties of the p-type channel 5' are changed to the n-type semiconductive properties. Though there is no positive mechanism of changing the semiconductive properties, the following mechanism can be supposed.

By forming the nitrogenous compound film 6 under the above-described predetermined conditions, oxygen is removed from the p-type channel 5' or from the interface of the p-type channel 5', source electrode 2 and drain electrode 3 respectively. It is supposed that the semiconductive properties of the p-type channel 5' are changed to the n-type properties as a result of the above.

The change in the above-described semiconductive properties may possibly involve the doping of the source gas. For example, when ammonia is used as the source gas, electrons are doped into the p-type channel 5'. Thus, it is supposed that the semiconductive properties of the p-type channel 5' are changed to the n-type properties.

Further, the plasma used in the conventional method for forming protective films damages the nanotube-shaped structure of the channel. However, according to the above method of the present invention, the protective film (nitrogenous compound film) can be formed almost without causing such damages to the nanotube-shaped structure. As a result, both of the n-type channel 5 having the nanotube-shaped structure and manufactured according to the above-described method of the present invention and the transistor 1 using the n-type channel 5 exhibit stable n-type semiconductive properties with a high probability even in the atmospheric air. Thus, the n-type channel 5 and the transistor 1 using this n-type channel 5 can be manufactured at a high yield.

In the above case, "almost without causing such damages" can be confirmed by the following tests, using the transistor using the p-type channel 5' before the format ion of the nitrogenous compound film 6 formed thereon and the n-type channel 5 after the formation of the nitrogenous compound film 6. That is, "almost without causing such damages" means that, in only 20 percent (or less) of transistors, a drain current flowing through the channel 5 is lower than 100 pA after the formation of the nitrogenous compound film 6. Specifically, the 20 percent of transistors is included in all transistors wherein a drain current flowing through the channel 5' was 100 pA or greater, at the time the gate voltage was applied as it is swept from −5 V to +5 V and at the time the drain voltage of 0.1 V was applied between the source electrode 2 and the drain electrode 3 at room temperature, before the formation of the nitrogenous compound film 6. Though there is no limit in the lower limit of the percentage, 0% is ideal.

In addition, "exhibit stable n-type semiconductive properties with a high probability even in the atmospheric air" means that generally 50% or more, preferably 70% or more and more preferably 90% or more of the channels 5' exhibiting the p-type semiconductive properties before the formation of the nitrogenous compound film 6 exhibits the n-type semiconductive properties after the formation of the nitrogenous compound film 6. Though there is no limit in the upper limit of the percentage, 100% is ideal.

As described above, the semiconductive properties of the channel 5' are changed to the n-type properties, through the nitrogenous compound film forming process. In addition, the surface of the channel 5' is covered with the nitrogenous compound film 6 so as to be protected from oxygen. As a result, the n-type channel 5 is protected from oxygen of the atmosphere, and thus exhibiting stable n-type semiconductive properties. Therefore, the transistor 1 using this n-type transistor 5 exhibits the n-type semiconductive properties stably, as well.

Further, another advantage of the above method of the present invention is that the high quality protective film can easily be attained. Conventionally, channel protection films are the silicon oxide, aluminum oxide, titanium oxide, zirconium oxide, hafnium oxide, etc. containing more than a predetermined level of oxygen. Among them, the dielectric constant of silicon oxide is low, approximately 3.9, thus may damage the n-type channel 5 at the time of film formation. Aluminum oxide, zirconium oxide, hafnium oxide, etc. are costly to form a high quality protective film without damaging the n-type channel 5. Titanium oxide is generally formed as a natural oxide film, by leaving a Ti film in the atmospheric air, resulting in the possibility of a large leakage current when used for the transistor and resulting in insufficient stability of film formation. However, according to the above method of the present invention, the nitrogenous compound film 6 can easily be formed as a high quality protective film protecting the channel 5 or a high quality insulating film insulating the channel 5, the source electrode 2, the drain electrode 3 and the gate electrode 4.

As described above, according to the method for manufacturing the channel for the n-type transistor of the present invention, the nanotube-shaped structure exhibiting the n-type semiconductive properties can be attained. Thus, the method for manufacturing the channel for the n-type transistor of the present invention can be employed as a method for manufacturing the nanotube-shaped structure exhibiting the n-type semiconductive properties.

[III. N-type transistor Sensor]

The n-type transistor of the present invention can be used as a transistor sensor used as a chemical sensor or biosensor. In this case, the n-type transistor sensor of the present invention using the n-type transistor of the present invention includes a source electrode, a drain electrode, an n-type channel arranged between the source electrode and the drain electrode, and a nitrogenous compound film of the present invention which is formed directly on the n-type channel.

Figure 5:
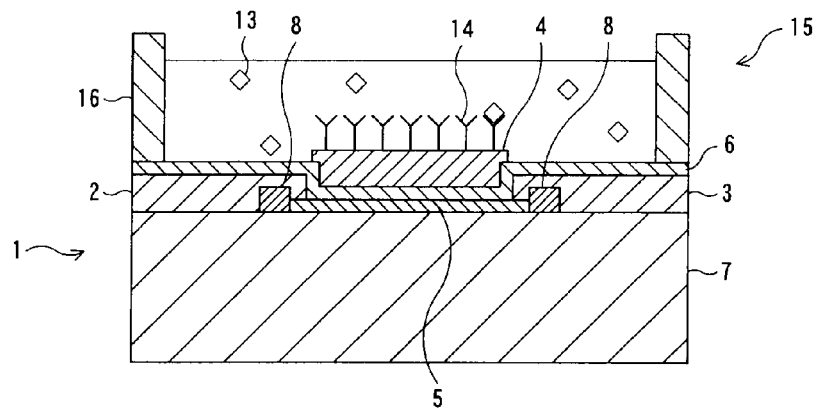
FIG. 5 is a cross sectional view exemplarily showing the configuration of an n-type transistor sensor according to one embodiment of the present invention.

There is no limit in the particular configuration of the n-type transistor sensor of the present invention, and the known configuration can arbitrarily be employed for the transistor sensor. For example, as shown in FIG. 5, specific substances 14 selectively interacting with substances to be detected (target object) 13 is fixed onto the gate electrode (e.g. top gate) 4 of the n-type transistor 1 of the present embodiment, thereby forming an n-type transistor sensor 15 of the present embodiment. When this sensor 15 is used, a liquid stopper 16 is provided in order for a specimen liquid to be in contact with the gate electrode 4, thus the specimen liquid inside the liquid stopper 16 is in contact with the gate electrode 4. If the substance to be detected 13 interacts with the specific substances 14 immobilized onto the gate electrode 4, the potential of the gate electrode 4 changes, due to the change in the electrical charge on the surface of the gate electrode 4. As a result, the drain current flowing through the n-type channel 5 changes. A reader (a detecting unit, such as an ammeter, etc.) reads a change in the drain current resulting from the potential change of the gate electrode 4, from the source electrode 2 or drain electrode 3, thereby detecting the substance to be detected 13.

FIG. 5 is a cross sectional view exemplarily showing the configuration of one embodiment of the n-type transistor sensor of the present invention. The same reference numerals are employed in FIG. 5 to identify the substantially same features in FIG. 1 to FIG. 4.

The n-type transistor sensor may be formed with the source electrode 2, the drain electrode 3, the n-type channel 5 and the nitrogenous compound film 6, without providing the gate electrode 4. For example, when silicon nitride is used as a nitrogenous compound, the silicon nitride film is a pH sensitive film. Thus, if the gate electrode 4 is not included in the configuration of FIG. 5, a pH sensor can be formed using the n-type transistor 1 of the present embodiment. This configuration can be the same as that of a chemical sensor using an existing ion-sensitive field-effect transistor (ISFET) that has been formed using a silicon field-effect transistor.

Further, a chemical sensor or biosensor (known as the ISFET) detecting the target object, such as ion, enzymes, proteins, etc. can also be formed by forming a sensitive film corresponding to the substance to be detected, on its surface.

The sensitive film can be immobilized or measured arbitrarily in accordance with the same method for the ISFET. As described with reference to FIG. 5, even when the gate electrode 4 is formed as a top gate, a sensitive film corresponding to the target substance is immobilized onto its gate electrode 4, thereby forming the same sensor.

When the n-type transistor 1 or n-type channel 5 according to the present embodiment is used as a sensor, they can be used for the sensor disclosed in following documents 3 to 5.

Document 3: Edited by Ikuo Karube, CMC Publishing Co. Ltd., "Biosensor", ISBN4-88231-759-1

Document 4: Edited by Toyoaki Omori, Fujitec Corporation, "Fukyu-ban Sensor Gijutsu (Popular edition of Sensor Technology)", ISBN4-938555-64-6

Document 5: P. Bergveld: Sensors and Actuators B 88 (2003) 1-20, Thirty years of ISFETOLOGY

[IV. Other]

The descriptions have been made to the one embodiment of the present invention. However, the present invention is not limited to the above embodiment, and modifications can arbitrarily be made without departing from the scope of the present invention.

For example, the above-described n-type transistor can be integrated so as to be used.

Further, for example, any of those described in the above embodiment can be implemented in arbitrary combination.

For example, it is possible to use the nanotube-shaped structure manufactured in accordance with the method for forming the channel for the n-type transistor, for any applications other than the transistor.

Further, the above-described n-type transistor can form a complementary circuit in combination with a p-type transistor.

EXAMPLES

Descriptions will now specifically be made to examples of the present invention. The present invention is not limited to the following examples, and modifications can be made without departing from the scope of the present invention.

Example 1

Back Gate Type Carbon Nanotube Transistor Including Nitrogenous Compound Film of Silicon Nitride

[1. Formation of Carbon Nanotube Transistor]

Figure 6A:
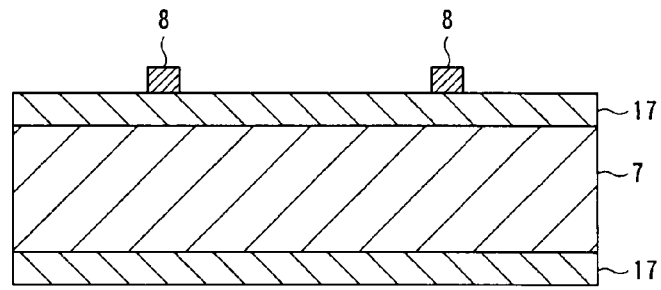
FIG. 6(a) to FIG. 6(d) are exemplary cross sectional views each explaining an operation in each process of a method for manufacturing a nanotube transistor using a carbon nanotube for a channel.
Figure 6B:
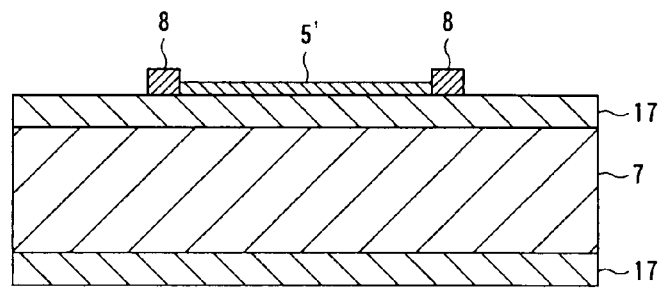
Figure 6C:
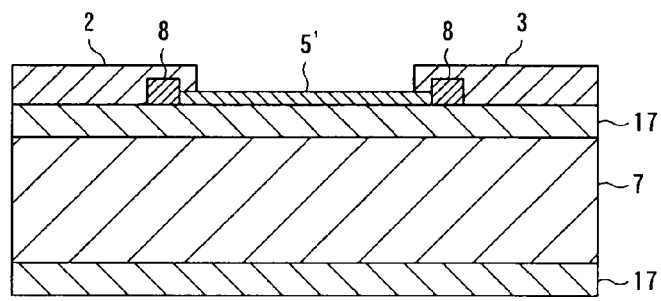
Figure 6D:
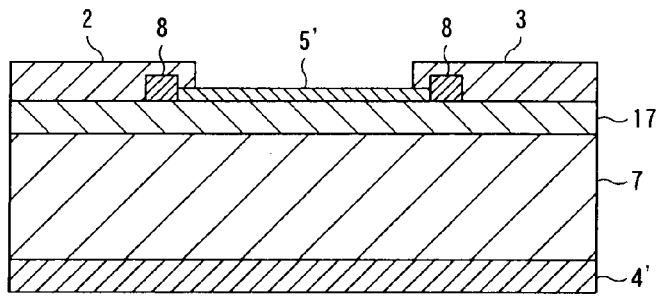

FIG. 6(a) to FIG. 6(d) are exemplary cross sectional views for explaining a process of manufacturing a nanotube transistor using a carbon nanotube in its channel, according to example 1. FIG. 6(a) shows the state of an element right after undergoing the catalyst patterning for channel formation, FIG. 6(b) shows the element right after the formation of a carbon nanotube, FIG. 6(c) shows the element right after the formation of a source and drain electrodes, and FIG. 6(d) shows the state of the element right after the formation of a back gate. In the following descriptions, the element halfway through the formation of the n-type transistor of the present invention is referred to as a "sample". Further, the same reference numerals are employed in FIG. 6(a) to FIG. 6(d) to identify the substantially same features in FIG. 1 to FIG. 5. In the following descriptions, the reference numerals are enclosed by parentheses, [ ].

(1) Preparation of Substrate

A conductive n-type silicon single crystal {a surface orientation of Si single crystal: (100)} substrate [7] is soaked for five minutes in an acid that is a mixture of sulfuric acid and hydrogen peroxide in a 4:1 volume ratio, so as to oxidize its surface. After that, the substrate is rinsed with running water for five minutes, and the oxide film is removed therefrom by an acid that is a mixture of hydrofluoric acid and pure water in a 1:4 volume ratio, thereby finally rinsing the substrate with running water for five minutes so as to clean the surface of the substrate [7]. The surface of the cleaned substrate [7] is thermally oxidized at 1100° C. for five hours under a condition of an oxygen flow rate of 3 L/min so as to form a silicon oxide insulating film [17] having a thickness of approximately 400 nm on the surface of the substrate [7].

(2) Formation of Channel

Subsequently, catalysts [8] for carbon nanotube (nanotube-shaped structure) growth are formed on the surface of the silicon oxide insulating film, in accordance with the following method.

Photoresist is patterned in a target area for crosslinking the carbon nanotube [5'] using a photolithography technique. The photolithography is performed as follows. Hexamethyldisilazane is spin-coated under the conditions at 500 rpm for ten seconds and at 4000 rpm for thirty seconds on the silicon oxide insulating film [17], and further photoresist (microposit S1818 manufactured by Shipley Far East Ltd.) is spin-coated thereon under the same conditions.

After the photoresist is spin-coated, the substrate [7] is put on a hotplate so as to be baked under the conditions at 90° C. for one minute. After baked, the photoresist-coated substrate [7] is soaked in monochlorobenzene for five minutes, and dried under nitrogen blow. After that, the substrate is put into an oven so as to be baked under the conditions at 85° C. for five minutes. After baked, the catalyst patterns are exposed to light using an aligner, developed in a developer {AZ300MIF developer (2.38%) manufactured by Clariant Corp.}, and rinsed with running water for three minutes, and then dried under nitrogen blow.

As described, silicon, molybdenum and iron are sequentially deposited in the form of films of respectively 10 nm, 10 nm and 3 nm on the photoresist-patterned sample, using an electron beam (EB) vacuum vapor deposition technique, so as to form the catalysts [8].

The photoresist is lifted off while soaking the sample in boiled acetone, and the sample is cleaned sequentially in acetone, ethanol and running water for three minutes in each case. Then, the sample is dried under nitrogen blow so as to form a sample on which the catalysts [8] for carbon nanotube [5'] growth are patterned {FIG. 6(a)}.

The catalyst [8]-patterned sample is placed in the furnace. Ethanol which has been bubbled with an argon gas is made to flow into the furnace at 750 mL/min, and a hydrogen gas is made to flow thereinto at 500 mL/min. At the same time, the carbon nanotube [5'] is grown between the catalysts [8] using a CVD technique under the conditions at 900° C. for ten minutes {FIG. 6(b)}. A temperature rise and a temperature fall are conducted while the argon gas is made to flow at a rate of 1000 mL/min.

(3) Formation of Source/Drain electrodes

To form the source electrode [2] and the drain electrode [3] at both ends of the carbon nanotube [5'], the photoresist is patterned using the above-described photolithography technique.

After the patterning, chromium and gold are deposited in the form of films of respectively 20 nm and 20 nm, using an EB vacuum vapor deposition technique. While the sample is soaked in boiled acetone, the photoresist is lifted off. The sample is cleaned in acetone, ethanol and running water sequentially for three minutes in each case, and is dried under nitrogen blow so as to form the source electrode [2] and the drain electrode [3] {FIG. 6(c)}. At this time, the minimum space between the source electrode [2] and the drain electrode [3] is 4 μm. Though not illustrated in FIG. 6(c), the source electrode [2] and the drain electrode [3] extend from the channel [5'] of the carbon nanotube, and include a contact pad respectively. Note that the contact pad represents an electrode (pad) of a little large square, for being contact with the probe at the head end of the electrode wiring.

After the patterning of the upper electrodes, such as the source electrode [2] and drain electrode [3], hexamethyldisilazane is spin-coated under the conditions at 500 rpm for ten seconds and at 4000 rpm for thirty seconds, in order to protect the element. The above-described photoresist is spin-coated thereon under the same conditions. After that, the photoresist is baked in an oven under the conditions at 110° C. for thirty minutes so as to form a resist film for protecting the element.

(4) Formation of Back Gate

The silicon oxide insulating film [17] is dry-etched to be removed from the backside of the substrate [7], using a reactive ion etching (RIE) system. An etchant used at this time is a sulfur hexafluoride gas etchant for performing the etching in the plasma of RF output 100 W for six minutes. After the silicon oxide insulating film [17] is removed from the back surface, titanium and gold are sequentially deposited in the form of films of respectively 10 nm and 100 nm so as to form a back gate [4'], using an EB vacuum vapor deposition technique.

A temporary protective film formed on the surface of the substrate [7] is cleaned in boiled acetone, acetone, ethanol and running water sequentially for three minutes in each case so as to be removed from the substrate [7], and is dried under nitrogen blow {FIG. 6(d)}

(5) Formation of Silicon Nitride Film

Figure 7:
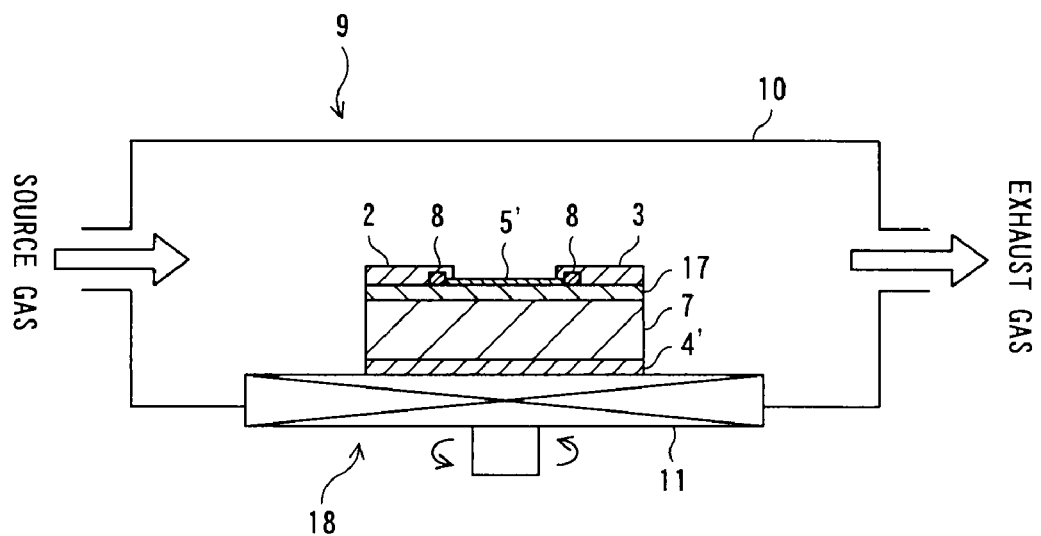
FIG. 7 is a diagram for explaining Example 1 of the present invention, and exemplarily showing the principal configuration of a device used for forming a protective film (a nitrogenous compound film) of silicon nitride.

FIG. 7 exemplarily shows the principal components of the system [9] used for forming the silicon nitride protective film (nitrogenous compound film) [6]. The same reference numerals are employed in FIG. 7 to identify the substantive same features in FIG. 1 to FIG. 6.

As shown in FIG. 7, the silicon nitride film as a nitrogenous compound is formed by placing the sample in a quartz furnace [10] using a thermal CVD technique. The sample is placed on a rotary stage [18] including a resistance heater [11]. The film formation is implemented in the atmospheric pressure at 800° C. for five minutes as being rotated on the stage. In this film formation, 3 volume % mono-silane gas (source gas) which has been diluted with an argon gas is made to flow at 20 mL/min, an ammonia gas (source gas) is made to flow at 1000 ml/min, and a nitrogen gas (source gas, inert gas) is made to flow at 3000 mL/min. A temperature rise and a temperature fall are conducted, while the nitrogen gas is made to flow at 3000 mL/min. Thus obtained silicon nitride protective film [6] (see FIG. 8) has a thickness of 200 nm.

(6) Formation of Contact Hole

To form a hole for contact (for wiring connection) in the silicon nitride protective film [6] on the above-described contact pads of the source electrode [2] and drain electrode [3], a contact hole is patterned using photoresist on the surface of the silicon nitride protective film [6] using a photolithography technique. Specifically, the photoresist is spin-coated on the surface of the silicon nitride protective film [6]. Then, a resist portion in a target position for the hole is patterned and removed therefrom. After that, the photoresist is baked in an oven under the conditions at 110° C. for thirty minutes. Subsequently, similarly to "(4) Formation of Back Gate", the silicon nitride protective film [6] on the source electrode [2] and drain electrode [3] is etched using RIE, so as to form a contact hole (not illustrated).

The element is cleaned in boiled acetone, acetone, ethanol and running water sequentially for three minutes in each case so as to remove the photoresist therefrom, and is dried under nitrogen blow.

Figure 8:
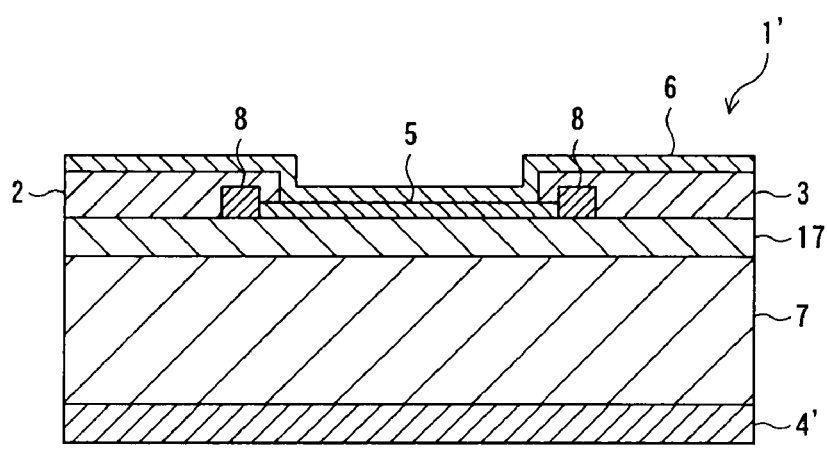
FIG. 8 is an exemplary schematic diagram of a back gate type carbon nanotube transistor having a protective film of silicon nitride, which is manufactured in Example 1 of the present invention.

FIG. 8 shows an exemplary schematic diagram of a back gate type carbon nanotube transistor (n-type transistor) [1'] having the protective film [6] of silicon nitride and being formed through the above processes. The same reference numerals are employed in FIG. 8 to identify the substantive same features in FIG. 1 to FIG. 7.

2. Measurement of Properties

The electrical properties of the carbon nanotube transistor [1'] formed in this example are measured in an atmosphere at room temperature, using 4156A semiconductor parameter analyzer manufactured by Agilent Technologies, Inc. Specifically, a drain current $I_{DS}$ is measured, at the time the a drain voltage $V_{DS}$=0.1 V is applied to the drain electrode [3] and a gate voltage $V_{GS}$ is applied to the back gate as it is swept from −5 to +5 V at 20 mV steps, based on the source electrode [2].

The measurement on the electrical properties is implemented using the same carbon nanotube transistor, both before the formation of the silicon nitride protective film [6] and after the formation of the silicon nitride protective film [6] and the contact hole.

Figure 9:
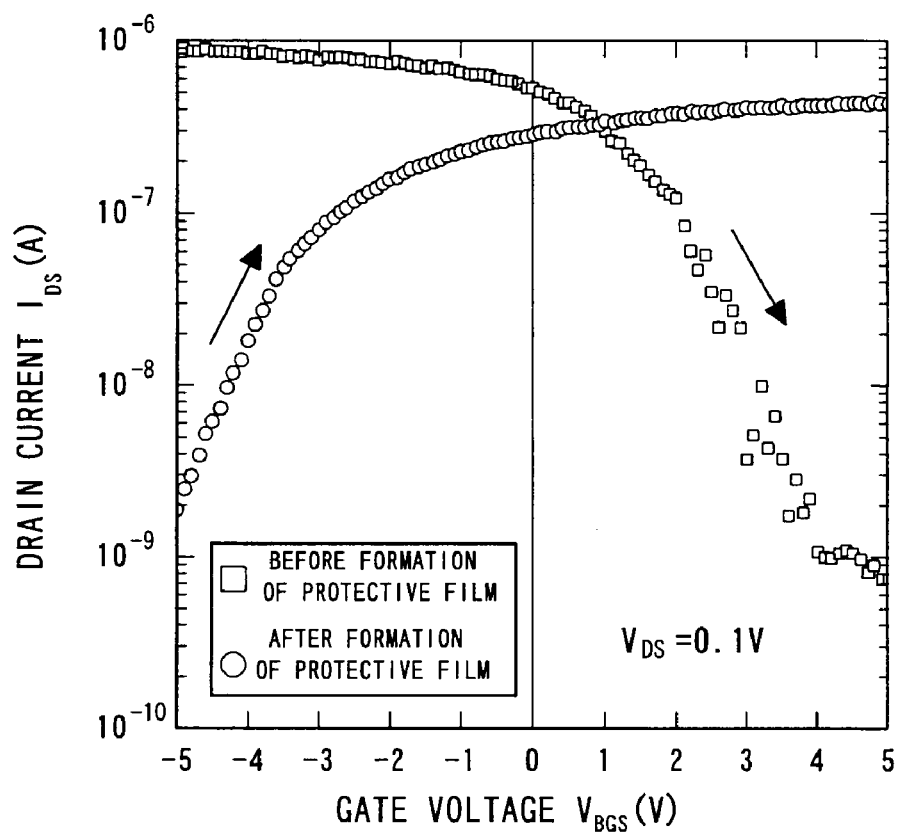
FIG. 9 is a graph showing the drain current $I_{DS}$-gate voltage $V_{GS}$ characteristics before and after the formation of the protective film of silicon nitride, in Example 1 of the present invention.

FIG. 9 shows the drain current $I_{DS}$-gate voltage $V_{GS}$ characteristics before and after the formation of the siliconnitride protective film. As shown in FIG. 9, the carbon nanotube transistor [1'] exhibits the p-type semiconductive properties wherein the drain current $I_{DS}$ decreases as the gate voltage $V_{GS}$ increases, before the formation of the siliconnitride protective film [6]. However, after the formation of the silicon nitride protective film [6], the transistor exhibits the n-type semiconductive properties wherein the drain current $I_{DS}$ increases as the gate voltage $V_{GS}$ increases. It is therefore confirmed that, as the p-type channel including the carbon nanotube (one kind of nanotube-shaped structure) is changed to an n-type channel, an n-type transistor can be manufactured from the p-type transistor.

Thirty-one transistors [1'] are formed on a single substrate [7] through the same operations as the above operations, and the electrical properties are measured in the same manner as the above. The drain current $I_{DS}$ of 100 pA or greater was measured in all of those elements (transistors) before and even after the film formation. Thus, unlike the conventional p-CVD technique, it is confirmed that the channel [5] is damaged little and the n-type transistor can stably be manufactured, according to the above-described manufacturing method.

Further, after the formation of the silicon nitride protective film [6], the manufactured carbon nanotube transistor [1'] is left in the atmospheric air (temperature of 26° C. and relative humidity of 25%) for one week. Then, the transistor exhibits the n-type semiconductive properties, as measured in the same manner as the above. As a result, it is shown that the silicon nitride protective film [6] formed in this example is very useful as a protective film for stabilizing the properties of the carbon nanotube transistor [1']. It is also confirmed that the n-type transistor [1'] manufactured according to the above method is stable in the atmospheric air.

Example 2

Top Gate Type Carbon Nanotube Transistor Including Silicon Nitride as Nitrogenous Compound Film

[1. Formation of Carbon Nanotube Transistor]

Titanium is used in place of chromium, and platinum is used in place of gold, to have thicknesses of respectively 10 nm and 90 nm, in the process of [(3) Formation of Source/Drain Electrodes] in the above [Example 1]. The silicon nitride insulating film (corresponding to the protective film in example 1) is formed to have a thickness of 50 nm in the process of [(5) Formation of Silicon Nitride Film]. The process of [(4) Formation of Back Gate] is implemented after the process of [(6) Formation of Contact Hole]. Other than these differences, the same method as that of example 1 is employed to form the carbon nanotube transistor [1'] having a back gate structure including the silicon nitride insulating film (protective film, gate insulating film).

((7) Formation of Top Gate)

The top gate [4] is formed on the surface of the silicon nitride insulating film [6] right above the channel [5] of the above-described carbon nanotube transistor [1'], according to the following method.

The resist coated on the surface of the silicon nitride insulating film [6] is patterned according to the photolithography technique of the above [Example 1]. Titanium and gold are deposited in the form of films of respectively 10 nm and 100 nm, using the EB vacuum vapor deposition technique. The resist is lifted off while soaking the sample in boiled acetone, and the sample is cleaned in acetone, ethanol and running water sequentially for three minutes in each case, and dried under nitrogen blow so as to form the top gate [4]. The top gate [4] extends from the channel [5] and has a contact pad (not illustrated), like the source electrode [2] and the drain electrode [3].

Figure 10:
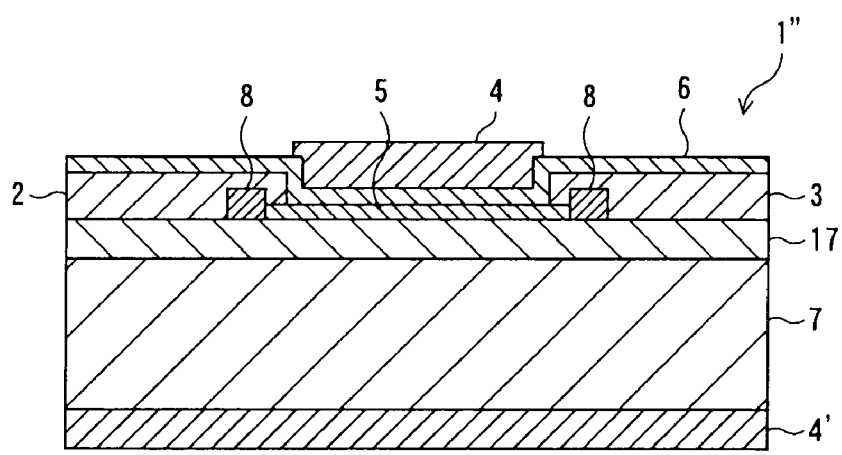
FIG. 10 is an exemplary schematic cross-sectional view of a top gate type carbon nanotube transistor having a silicon nitride protective film (gate insulating film), which is manufactured in Example 2 of the present invention.

FIG. 10 shows an exemplary cross sectional view of a top gate type carbon nanotube transistor [1''] having the silicon nitride insulating film (the gate insulating film) [6] and formed according to the above process. The same reference numerals are employed in FIG. 10 to identify the substantive same features in FIG. 1 to FIG. 8.

[2. Measurement of Properties]

Figure 11:
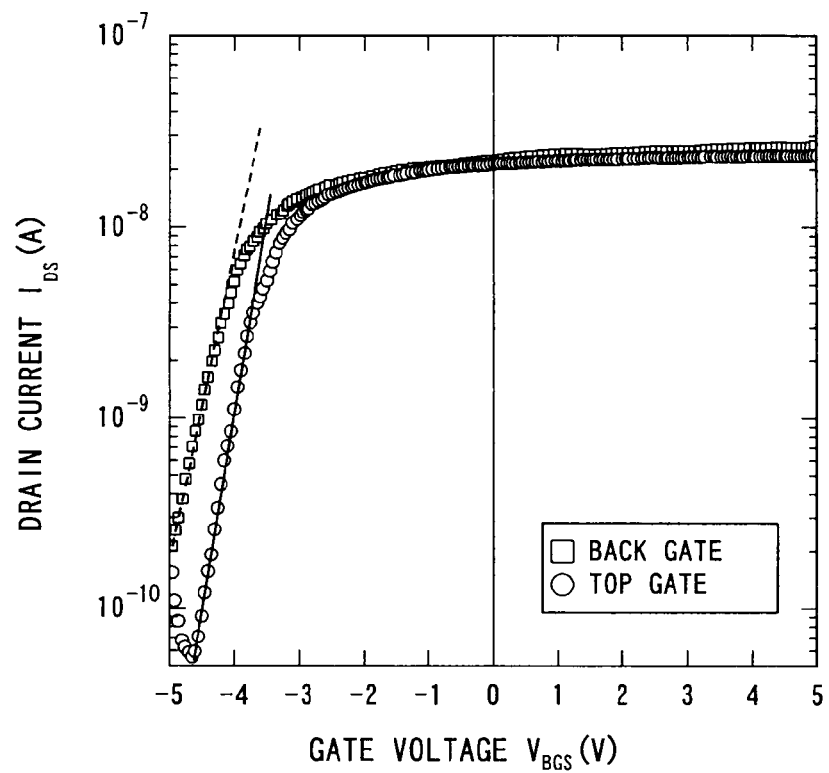
FIG. 11 is a graph showing the gate voltage-drain current characteristics both when a back gate is used and when a top gate is used, in Example 2 of the present invention.

The electrical properties of the top gate type carbon nanotube transistor [1''] formed in this example are measured by the same system and in the same environment as the above [Example 1]. FIG. 11 shows the gate voltage $V_{GS}$-drain current $I_{DS}$ characteristics, both when the back gate [4'] is used and when the top gate [4] is used. The drain voltage $V_{DS}$ is set at 0.1 V, in both cases of the gate electrodes [4] and [4']. When the back gate [4'] is used, the top gate [4] is made to float. On the other hand, when the top gate [4] is used, the back gate [4'] is at the same potential as the source electrode [2]. Further, the gate voltage $V_{GS}$ is swept from −5 V to 5 V at 20 mV steps.

As a result, the transistor exhibits the n-type semiconductive properties, wherein the drain current $I_{DS}$ increases as the gate voltage $V_{GS}$ increases, in both cases. According to the above manufacturing method, it is confirmed that an n-type transistor can be manufactured from a p-type transistor, by changing the p-type channel having the carbon nanotube (one kind of the nanotube-shaped structure) to an n-type channel.

Though the silicon nitride insulating film [6] has a thickness of 50 nm, it has a very low leakage current of approximately 3 pA between the top gate [4] and the source electrode [2] or drain electrode [3]. Based on this fact, it is confirmed that the silicon nitride insulating film [6] is excellent also as an insulating film.

Further, as shown in FIG. 11, when the drain current $I_{DS}$ is plotted against the gate voltage $V_{GS}$ on an exponential scale, the slope of the drain current $I_{DS}$ is obtained so as to be measured in an area wherein the drain current $I_{DS}$ linearly increases against the gate voltage $V_{GS}$ (a weak inversion film area). Specifically, the measurement is done, while the slope of the dash segment is set as the slope of the weak inversion film area of the back gate, and the slope of the solid segment is set as the slope of the weak inversion film area of the top gate.

The gate voltage $V_{DS}$ necessary for changing the drain current $I_{DS}$ by one figure in the weak inversion film area of the field-effect transistor is defined as a subthreshold coefficient S, and is a parameter representing the switching characteristics of the field-effect transistor, and is desirably a small value. The subthreshold coefficient S decreases, as the gate capacity increases.

As seen in FIG. 11, a subthreshold coefficient S is 650 mV/decade, when a gate voltage $V_{GS}$ is applied from the back gate, and a subthreshold coefficient S is 450 mV/decade, when a gate voltage $V_{GS}$ is applied from the top gate. That is, the top gate is lower than the back gate. Therefore, the transistor [1''] manufactured in this example is excellent in the switching characteristics when the top gate is used, compared to when the back gate is used. It can be assumed that the siliconnitride insulating film [6] has a dielectric constant approximately 1.8 times greater than that of the silicon oxide insulating film [17] of the substrate [7]. As a result, it is shown that the silicon nitride insulating film [6] used in this example is excellent as an insulating film of the top gate [4].

Example 3

Application Example of Top Gate Type Carbon Nanotube Transistor Having Silicon Nitride Insulating Film to Biosensor

[1. Formation of Sensor]

An insulating alumina monocrystal substrate is used in place of the silicon monocrystal substrate [7] having the silicon oxide insulating film [17], in the [Example 2]. 0.3 volume % mono-silane gas which has been diluted with argon is used in place of 3 volume % mono-silane gas whose source gas has been diluted with argon, in the process of [(5) Formation of Silicon Nitride Film]. The source gas is changed to flow at 50 mL/min from 20 mL/min. Further, the silicon nitride insulating film (corresponding to the protective film of Example 1 or the insulating film of Example 2) [6] has a thickness of 37 nm. Other than these differences, the same method as that of [Example 2] is employed to form the top gate type carbon nanotube transistor [1"].

Figure 12:
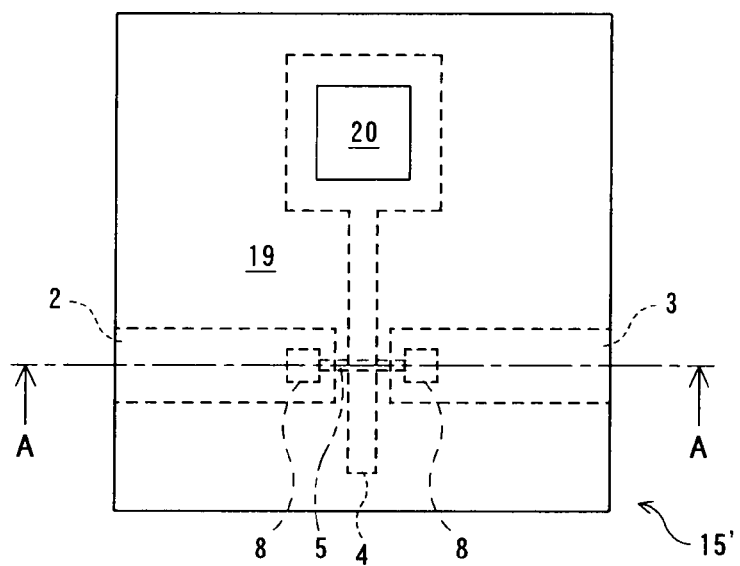
FIG. 12 is an exemplary top view of a transistor sensor manufactured in Example 3 of the present invention.
Figure 13:
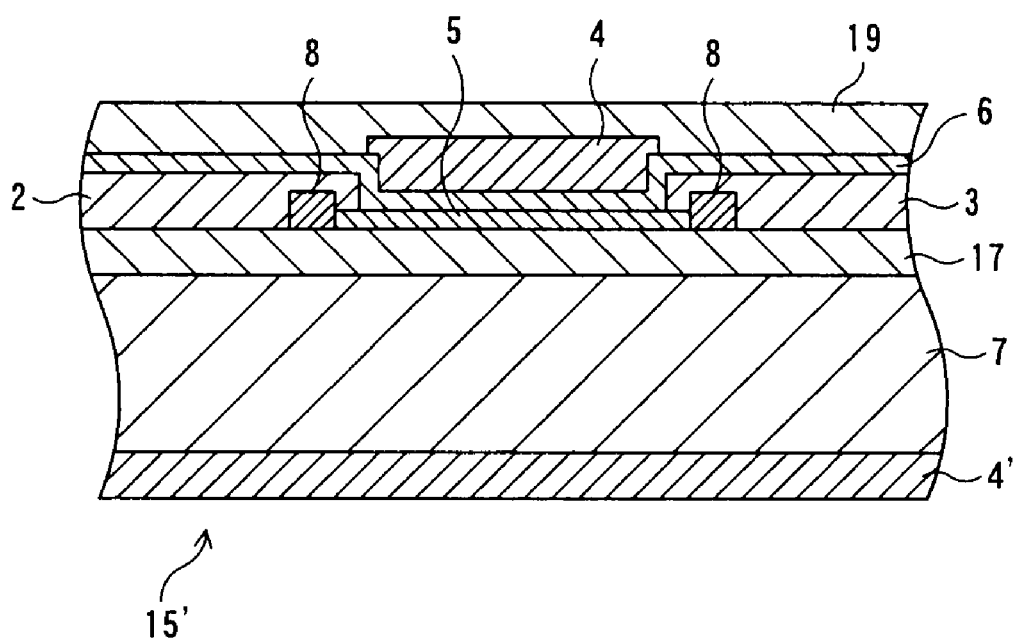
FIG. 13 is a cross sectional view for explaining the transistor manufactured in Example 3 of the present invention, taken along a line surface A-A of the transistor sensor in FIG. 12, and exemplarily showing an enlarged view near the channel.

For the purpose of protecting the surface of the transistor [1"] except the position of the contact pad of the top gate [4], the resist is patterned using the photolithography similarly to [Example 1] so as to form a resist film [19] on the upper surface of the transistor [1"] except the position of the contact pad. In this way, a hole [20] is formed on the contact pad of the top gate [4]. That is, the hole [20] is formed in the position corresponding to the contact pad. After this, the photoresist is baked so as to be hardened in an oven under the conditions at 120° C. for one hour. Thus formed transistor sensor [15'] is shown in FIG. 12 and FIG. 13. FIG. 12 is an exemplary top view of the transistor sensor [15'], while FIG. 13 is a cross sectional view taken along a line surface A-A of the transistor sensor [15'] in FIG. 12 and exemplarily showing an enlarged view near its channel [5]. The same reference numerals are employed in FIG. 12 and FIG. 13 to identify the substantive same features in FIG. 1 to FIG. 8 and FIG. 10.

[2. Measurement of Properties]

Figure 14:
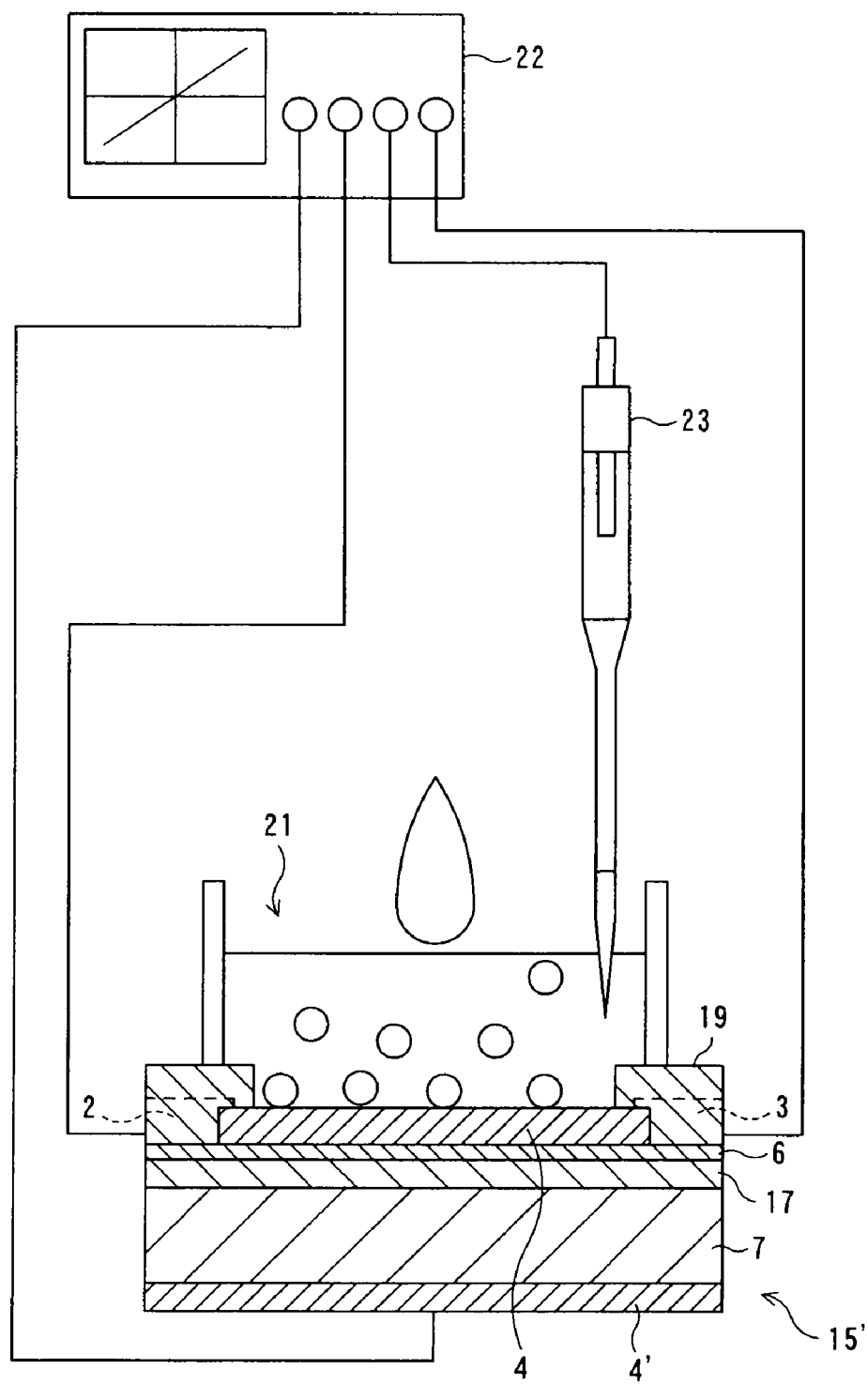
FIG. 14 is an exemplary schematic diagram of a detector used in Example 3 of the present invention.

A detector shown in FIG. 14 is assembled. That is, a well [21] is formed using silicone on the upper surface of the above-described transistor sensor [15'], and the surface of the top gate [4] is soaked in a phosphoric acid buffer solution (PB) (pH7.4, 10 mM) through the contact hole [20] of the top gate [4]. The voltages of the source electrode [2], drain electrode [3] and back gate [4'] are controlled using 4156A semiconductor parameter analyzer [22] manufactured by Agilent Technologies, Inc. The same reference numerals are employed in FIG. 14 to identify the substantive same features in FIG. 1 to FIG. 8, FIG. 10, FIG. 12 and FIG. 13.

The electrical properties are measured with a drain voltage $V_{DS}$ of 0.1 V, a back gate voltage $V_{BGS}$ of 0 V and a silver/silver chloride reference electrode (R.E.) [23], wherein a constant voltage (0 V) of a top gate voltage $V_{TGS}$ is applied to the top gate [4] through the PB in the well [21], and wherein the drain current $I_{DS}$ is measured as a function of time. At the measurement, pig serum albumin (PSA) is employed as protein so that a PB solution containing PSA is dropped appropriately onto the well.

Figure 15:
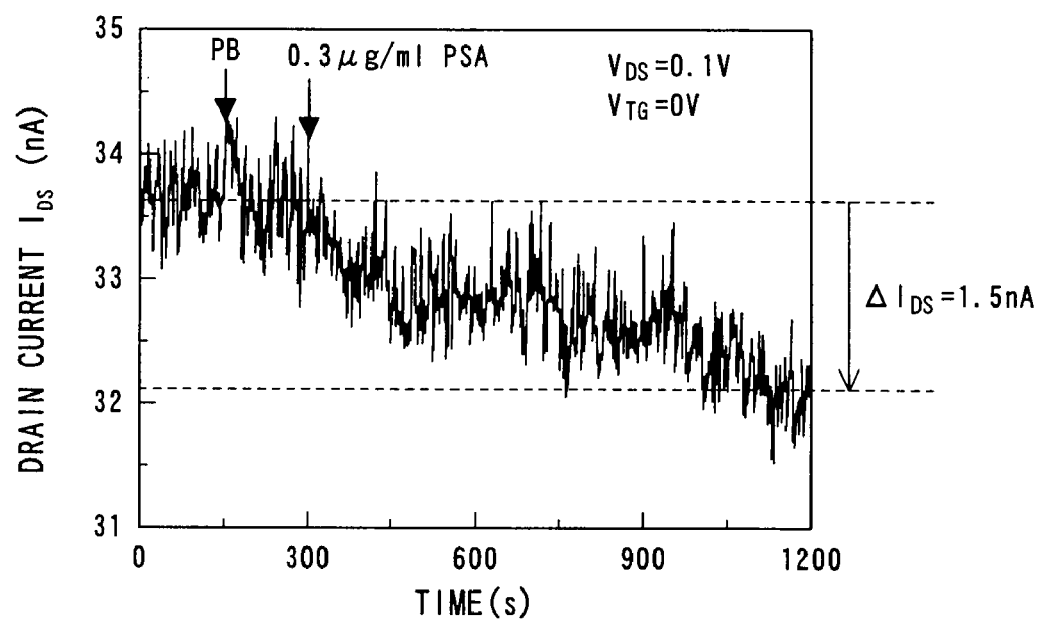
FIG. 15 is a graph showing the time variation of the drain current at the time a solution of pig serum albumin is dropped onto a well, in Example 3 of the present invention.

FIG. 15 shows a graph of the time variation of the drain current $I_{DS}$ at the time a PB solution containing PSA is dropped onto the well [21]. After 180 s upon measurement, though the same concentration PB of 10 μL is dropped, the drain current $I_{SD}$ does not remarkably change. After 300 s upon measurement, the PB solution containing PSA is so dropped that the PSA concentration inside the well [21] will be 0.3 μg/mL. As a result, the drain current $I_{DS}$ is reduced by approximately 1.5 nA after 1200 s upon measurement.

As described, the drain current $I_{DS}$ does not remarkably change, even the PB is dropped. However, the drain current $I_{DS}$ is reduced, after the PB solution containing PSA was dropped. It can thus be considered that the reduction of this drain current $I_{DS}$ occurs because the top gate [4] becomes a negative potential with respect to the R.E. [23], as a result of PSA with a negative charge at pH7.4 being adsorbed onto the top gate [4]. As a result, it is shown that the transistor sensor [15'] formed in this example has high sensitivity in detecting chemical substances.

INDUSTRIAL APPLICABILITY

The present invention may widely be applicable to arbitrary fields, for example, not only to the field of integrated circuits, but also to the analytical fields of chemical sensors, biosensors, etc.

What is claimed is:

1. An n-type transistor comprising:
    a source electrode;
    a drain electrode;
    a gate electrode;
    an n-type channel which has a nanotube-shaped structure and is provided between said source electrode and said drain electrode; and
    a film of a nitrogenous compound which is formed directly on said channel while being heated, wherein
    said channel is a channel which is converted from p-type to n-type at the time of film formation of the nitrogenous compound.

2. The n-type transistor according to claim 1, wherein said film of the nitrogenous compound is formed at temperature of 500° C. or higher and 1600° C. or lower.

3. The n-type transistor according to claim 1, wherein said film of the nitrogenous compound is formed through a thermal CVD technique.

4. The n-type transistor according to claim 1, wherein said film of the nitrogenous compound has an oxygen content of 0 atomic % or more and 10 atomic % or less.

5. The n-type transistor according to claim 1, wherein said film of the nitrogenous compound has a hydrogen content of 5 atomic % or more and 20 atomic % or less.

6. The n-type transistor according to claim 1, wherein said film of the nitrogenous compound is formed only on a top and side of said channel.

7. The n-type transistor according to claim 1, wherein said nanotube-shaped structure is a carbon nanotube.

8. The n-type transistor according to claim 1, wherein the nitrogenous compound is silicon nitride.

9. The n-type transistor according to claim 1, wherein said gate electrode is a top gate which is formed on said channel through said film of the nitrogenous compound.

10. The n-type transistor according to claim 1, wherein said film is formed directly on said channel, said source electrode, and said drain electrode while being heated.

11. An n-type transistor sensor comprising:
    a source electrode;
    a drain electrode;
    a gate electrode;
    an n-type channel which has a nanotube-shaped structure and is provided between said source electrode and said drain electrode; and a film of a nitrogenous compound which is formed directly on said channel while being heated, wherein said channel is a channel which is converted from p-type to n-type at the time of film formation of the nitrogenous compound and said sensor detects a target object to be detected as a variation of a current flowing through said channel.

12. The n-type transistor sensor according to claim 11, wherein said film of the nitrogenous compound is formed at temperature of 500° C. or greater and 1600° or lower.

13. The n-type transistor sensor according to claim 11, wherein said film of the nitrogenous compound is a film which is formed through a thermal CVD technique.

14. The n-type transistor according to claim 11, wherein said film is formed directly on said channel, said source electrode, and said drain electrode while being heated.

* * * * *